(12) United States Patent
Nakatani et al.

(10) Patent No.: US 9,812,355 B2
(45) Date of Patent: Nov. 7, 2017

(54) METHOD OF MANUFACTURING SEMICONDUCTOR DEVICE

(71) Applicant: HITACHI KOKUSAI ELECTRIC INC., Tokyo (JP)

(72) Inventors: Kimihiko Nakatani, Toyama (JP); Hiroshi Ashihara, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/280,239

(22) Filed: Sep. 29, 2016

(65) Prior Publication Data
US 2017/0092535 A1   Mar. 30, 2017

(30) Foreign Application Priority Data

Sep. 29, 2015   (JP) .................................. 2015-191267

(51) Int. Cl.
*H01L 21/768*   (2006.01)
*H01L 23/532*   (2006.01)
*H01L 21/3213*  (2006.01)

(52) U.S. Cl.
CPC .. *H01L 21/76849* (2013.01); *H01L 21/32135* (2013.01); *H01L 21/7685* (2013.01); *H01L 21/76843* (2013.01); *H01L 21/76856* (2013.01); *H01L 23/53238* (2013.01)

(58) Field of Classification Search
CPC .................................. H01L 21/768–21/76898
See application file for complete search history.

(56) References Cited

U.S. PATENT DOCUMENTS

| | | | | |
|---|---|---|---|---|
| 5,529,953 A * | 6/1996 | Shoda | ............... | H01L 21/76879 257/E21.586 |
| 6,156,382 A | 12/2000 | Rajagopalan et al. | | |
| 7,576,006 B1 * | 8/2009 | Yu | ..................... | H01L 21/67207 257/E21.575 |
| 7,727,881 B1 * | 6/2010 | Chattopadhyay | | |
| | | | ......................... | H01L 21/76834 257/E21.582 |
| 2009/0186481 A1 * | 7/2009 | Suzuki | ................ | C23C 16/0218 438/686 |

(Continued)

FOREIGN PATENT DOCUMENTS

| | | |
|---|---|---|
| JP | 2007-042662 A | 2/2007 |
| JP | 2011-006783 A | 1/2011 |

*Primary Examiner* — Zandra Smith
*Assistant Examiner* — Molly Reida
(74) *Attorney, Agent, or Firm* — Volpe and Koenig, P.C.

(57) ABSTRACT

A method of manufacturing a semiconductor device includes providing a substrate having an insulating film and a plurality of conductive films on a surface; reducing the substrate by supplying a first reducing gas to the substrate so that at least one of a plurality of process conditions of the first reducing gas is controlled so that a product of a plurality of process conditions becomes a predetermined value, wherein the process conditions of the first reducing gas include a partial pressure of the first reducing gas in a region where the substrate exists and a time taken to supply the first reducing gas to the substrate corresponding to a temperature of the first reducing gas; and selectively forming a metal film on the plurality of the reduced conductive films by supplying a second reducing gas and a metal-containing gas to the substrate.

13 Claims, 12 Drawing Sheets

(56) References Cited

U.S. PATENT DOCUMENTS

| | | | |
|---|---|---|---|
| 2009/0269507 A1* | 10/2009 | Yu | H01L 21/02074 427/535 |
| 2010/0081274 A1* | 4/2010 | Ishizaka | C23C 16/0236 438/653 |
| 2010/0081276 A1* | 4/2010 | Ishizaka | H01L 21/02063 438/653 |
| 2010/0248473 A1* | 9/2010 | Ishizaka | H01L 21/02063 438/659 |
| 2010/0297846 A1 | 11/2010 | Kaga et al. | |

* cited by examiner

*FIG. 11A*    *FIG. 11B*
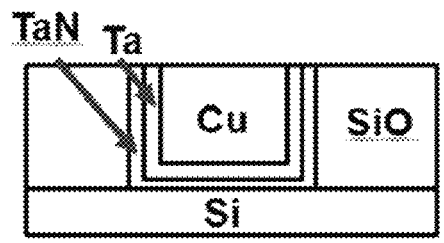  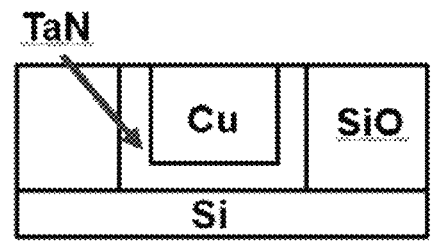
*FIG. 12*
| | 10 MINUTES | 15 MINUTES | 20 MINUTES |
|---|---|---|---|
| COMPARATIVE EXAMPLE 1 (Ta/TaN) | 10min | 15min | 20min |
| COMPARATIVE EXAMPLE 2 (TaN) | 10min | 15min | 20min |

METHOD OF MANUFACTURING SEMICONDUCTOR DEVICE

BACKGROUND

Technical Field

The present teachings relate to a method of manufacturing a semiconductor device.

Related art

As a process of processes of manufacturing a semiconductor device, there is a process of forming a metal film on a substrate (JP 2011-6783 A). In addition, there is a case where it is desired that a metal film is selectively formed in a predetermined region on a substrate.

SUMMARY

The present teachings are to provide a new technique capable of being applied to selective formation of a metal film in a predetermined region on a substrate.

According to one aspect, there is provided a method of manufacturing a semiconductor device, including:

providing a substrate having an insulating film and a plurality of conductive films on a surface;

reducing the substrate by supplying a first reducing gas to the substrate so that at least one of a plurality of process conditions of the first reducing gas is controlled so that a product of a plurality of process conditions becomes a predetermined value, wherein the process conditions of the first reducing gas include a partial pressure of the first reducing gas in a region where the substrate exists and a time taken to supply the first reducing gas to the substrate corresponding to a temperature of the first reducing gas; and selectively forming a metal film on the plurality of the reduced conductive films by supplying a second reducing gas and a metal-containing gas to the substrate.

According to the present teachings, it is possible to provide a technique for selective forming a metal film in a predetermined region on a substrate.

BRIEF DESCRIPTION OF THE DRAWINGS

FIG. 4A is a cross-sectional diagram, and FIG. 4B is a plan diagram;

FIG. 5A is a diagram illustrating a substrate before the processes, FIG. 5B is a diagram illustrating a state that reducing gas molecules are adsorbed on the substrate; FIG. 5C is a diagram illustrating a state that a metal film is formed on the substrate, and FIG. 5D is a diagram illustrating a state that etchback is performed;

FIGS. 11A and 11B are cross-sectional diagrams of substrates illustrating LS patterns in Comparative Examples, FIG. 11A is a cross-sectional diagram of a substrate used in Comparative Example 1, and FIG. 11B is a cross-sectional diagram of a substrate used in Comparative Example 2;

FIG. 12 illustrates pictures of SEM of Comparative Examples 1 and 2;

DETAILED DESCRIPTION

With the miniaturization of large scale Integrated circuits (hereinafter, referred to as LSIs), miniaturization of transistors and miniaturization of processes of forming interconnection have also been advanced. In recent years, in some cases, as interconnection materials, copper (Cu) having a resistivity lower than that of aluminum (Al) and an excellent electrical reliability has been applied for the LSIs. In case of forming Cu as interconnection, for example, although a halide of Cu may be employed, since the halide of Cu has a low vapor pressure, in some cases, it may be difficult to perform a process using dry etching. In such a case, a damascene process method of forming interconnection by forming a groove (trench) or connection hole (via) in an insulating film in advance and burying Cu therein may be employed.

In the damascene process method, excess portions of the buried Cu exposed to a surface of a substrate are removed by a chemical mechanical polishing method (CMP method). At this time, in the CMP method, the process is realized by scraping a surface of a wafer with a polishing agent called slurry and a polishing cloth called a polishing pad. In the final process, cleaning is performed by finishing the surface of Cu with hydrophilic chemicals. After the CMP of the Cu is performed, a process of sealing the surface of Cu with, for example, a silicon oxide film or the like as an insulating film is rapidly performed by using a chemical vapor deposition method (CVD method) or the like. With respect to the Cu interconnection, in some cases, a surface being in contact with the insulating film becomes a weak point in reliability associated with electrical or thermal stress. This is because other three surfaces (bottom surface and side surfaces are in contact with a metal surface of a transition metal or the like, but the surface being in contact with the insulating film has a weak strength of adhesion to the Cu. Therefore, in the interconnection process for LSIs, a method of engineering the control of the surface being in contact with the insulating film is performed to improve the reliability may be taken.

As one of the methods, there is a method of selectively forming a metal on a top surface of the Cu. As the method of selectively forming a metal only on the Cu, there is a method of precipitating a metal such as a cobalt tungsten phosphide (CoWP) or a cobalt tungsten boride (CoWB) by a wet process such as plating, a method of forming a metal by using a difference in growth start time (difference in incubation time) between an insulating film and the Cu by a dry process, for example, a CVD method or the like, or a method of forming a Cu silicide by flowing a small amount of a gas such as monosilane which is easily reacted with the Cu. Herein, among the methods of preferentially forming a metal film on a top surface of the Cu, a method using W will be described.

Figure 4A:
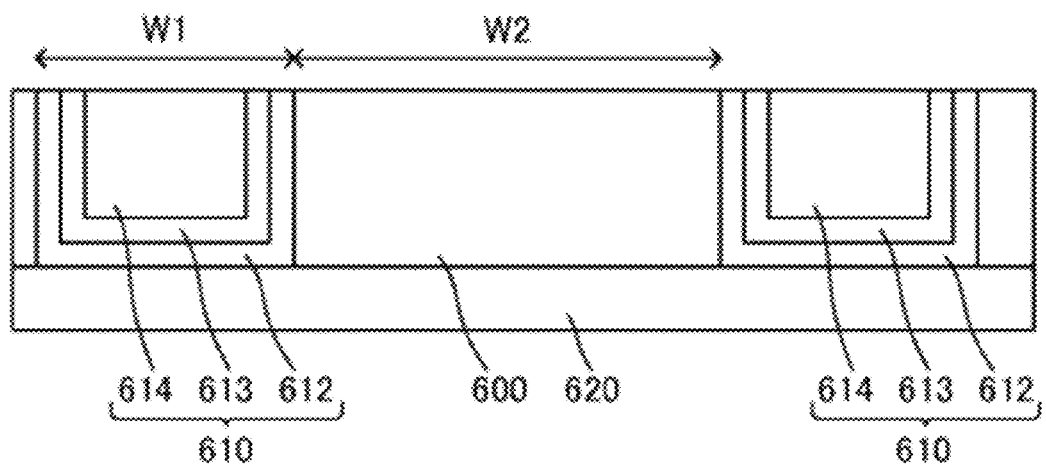
FIGS. 4A and 4B are diagrams illustrating an L/S pattern formed on a substrate.
Figure 4B:
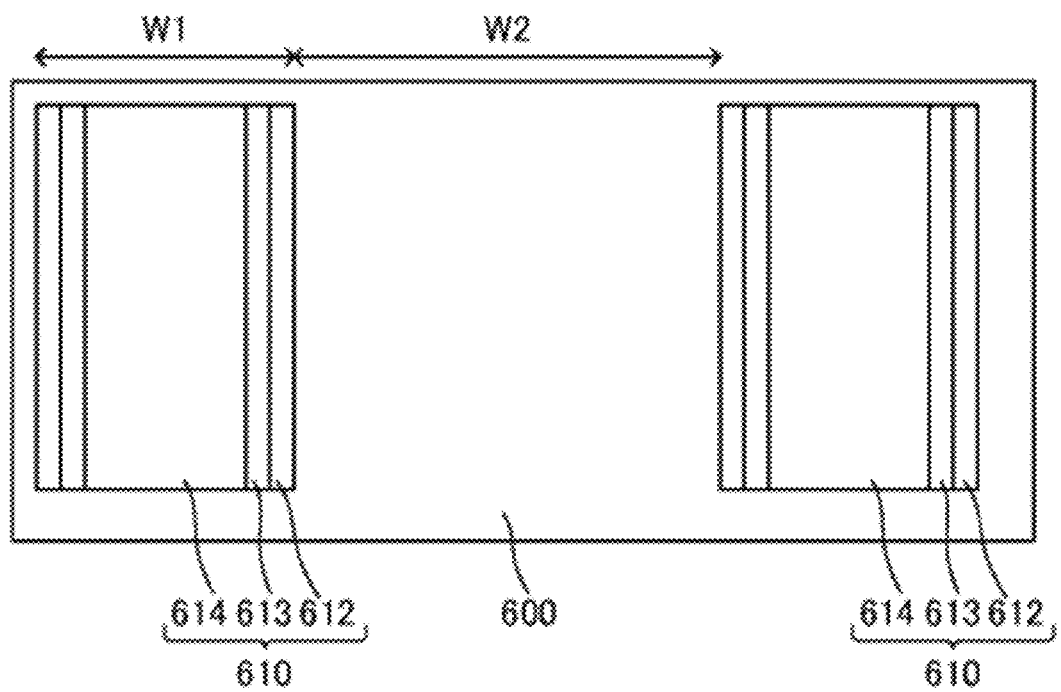
Figure 5A:
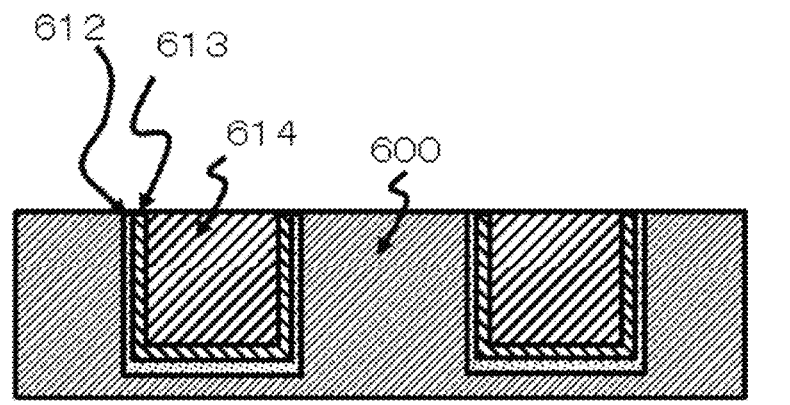
FIGS. 5A to 5D are diagrams illustrating a sequence of processes of the present teachings.
Figure 5B:
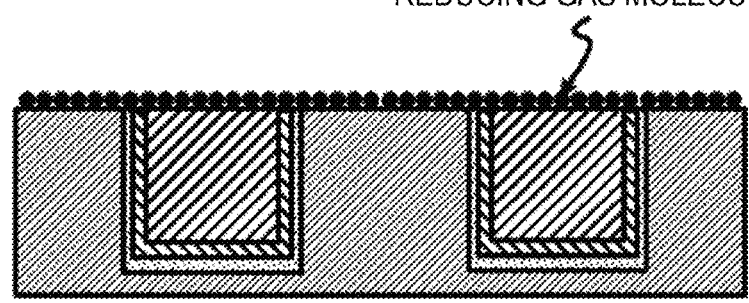
Figure 5C:
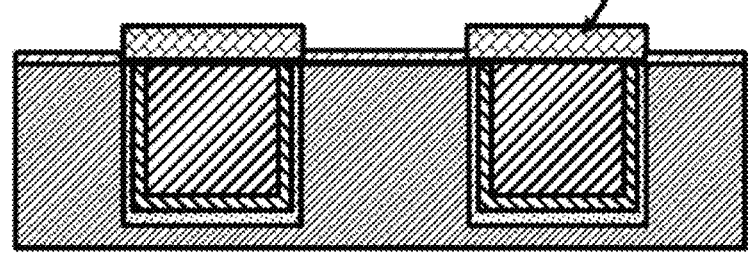
Figure 5D:
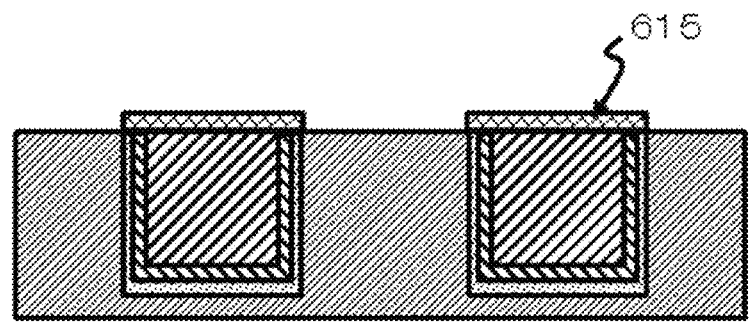

As a barrier metal of the Cu interconnection, in many cases, a tantalum film (Ta film) and a tantalum nitride film (TaN film) are employed. For example, as illustrated in FIGS. 4A and 4B, an example of having a substrate 620 and an insulating film 600 and a conductive film 610 formed on the substrate 620 in aline and space (L/S) pattern will be described. The insulating film 600 is formed with, for example, SiO. The conductive film. 610 is configured with a Ta film 612 covering an inner surface of the groove, a TaN film 613 formed on the Ta film 612, and a Cu film 614 filling on the TaN film 613. A width of the conductive film 610 is, for example, in a range of several tens of nanometers to several hundreds of nanometers, and a length of the conductive film 610 is, for example, several millimeters. Various L/S patterns can be formed by changing the width W1 of the conductive film 610 and the width W2 of the insulating film.

A W film is formed on the substrate where the L/S pattern is formed. However, in case of exposing by using tungsten hexafluoride ($WF_6$) as a source gas of W, $WF_6$ is preferentially decomposed and reduced in an exposed Ta portion, and thus, there is a case where the film is grown in an abnormal shape. For example, there is a case where a film forming speed (film forming rate) of W on the Ta film is abnormally faster than the film forming speeds on the Cu film and the TaN film. The inventors studied hard to find out that, in case of exposing a barrier metal which has no exposed Ta portion and is entirely configured with the TaN film similarly by using $WF_6$, no abnormal growth is observed, and W can be selectively formed on the top surface of Cu. In addition, the inventors found that the abnormal growth on the Ta is caused from the fact that a non-nitrized Ta has a work function smaller than that of the TaN film and has a strong reduction effect and electrons are more actively supplied to the $WF_6$ from the Ta. Namely, it is considered that the incubation time that is a time required until the growth on the Ta film of the W film is started is shorter than the incubation times on the Ta film and the Cu film of the W film.

Therefore, the inventors and the like contrived decreasing a difference in incubation time among the plurality of the conductive films by supplying a reducing gas to the substrate before the W film as a metal film is formed on the substrate where an insulating film and a plurality of conductive films having different incubation times are exposed to a surface thereof. More specifically, as illustrated in FIGS. 5A to 5D, by supplying a reducing gas to the insulating film 600 and the substrate (FIG. 5A) where the Ta film 612, the TaN film 613, and the Cu film 614 are exposed on the surface thereof, reducing gas molecules are adsorbed on the surface of the substrate (FIG. 5B), the W film 615 is selectively (preferentially) grown on the Ta film 612, the TaN film 613, and the Cu film 614 (FIG. 5C), and the W film 615 formed on the insulating film 600 is removed (etched back) by etching (FIG. 5D), so that the W film 615 can be selectively grown on the Ta film 612, the TaN film 613, and the Cu film 614 as the conductive films of the substrate. At this time, by regulating process conditions such as a temperature of the reducing gas supplied to the substrate, a partial pressure of the reducing gas in the region where the substrate exists, and a time taken to supply the reducing gas to the substrate before the formation of the W film, the difference in incubation time between the plurality of conductive films can be controlled so as to be 0.01% or more and 50% or less. Details will be described hereinafter.

First Embodiment of the Present

Figure 1:
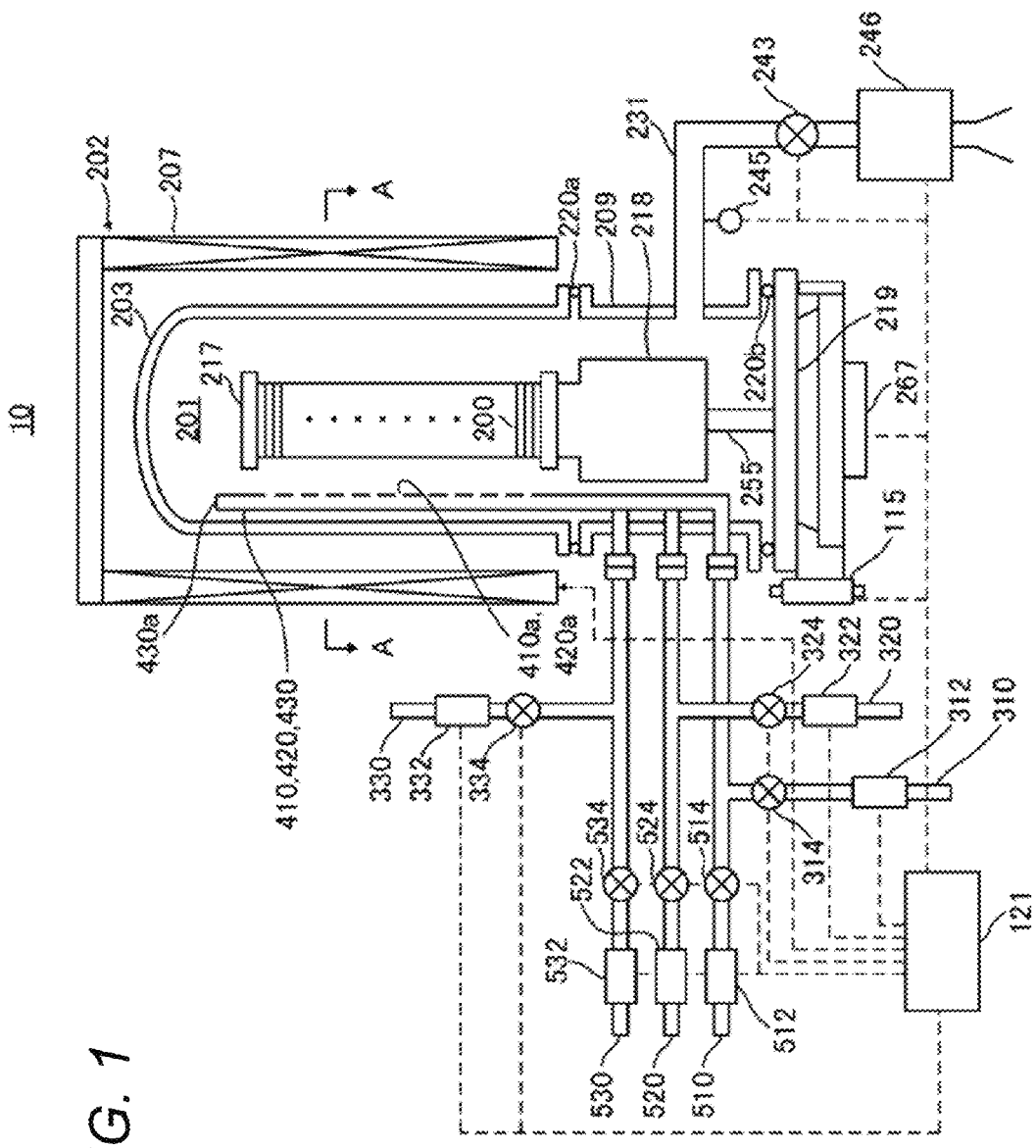
FIG. 1 is a longitudinal cross-sectional diagram illustrating a processing furnace as a schematic diagram of a configuration of a processing furnace of a substrate processing apparatus suitably used in a first embodiment.
Figure 2:
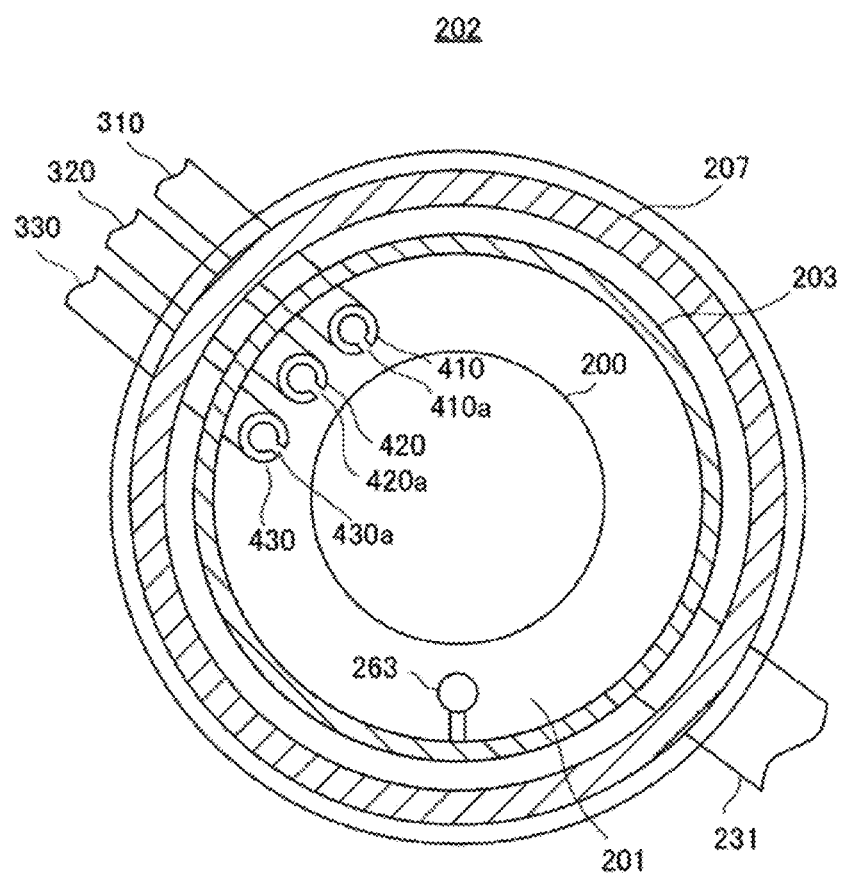
FIG. 2 is a cross-sectional diagram taken along line A-A of FIG. 1.

Hereinafter, a first embodiment of the present teachings will be described with reference to FIGS. 1 and 2. A substrate processing apparatus 10 is configured as an example of an apparatus used for a substrate process which is one of processes of manufacturing a semiconductor device.

(1) Configuration of Processing Furnace

A heater 207 as a heating unit (heating mechanism, heating system) is provided to a processing furnace 202. The heater 207 is formed in a cylindrical shape of which upper side is closed.

A reaction tube 203 constituting a reaction container (processing container) is installed inside the heater 207 to be concentric with the heater 207. The reaction tube 203 is made of a heat resistant material or the like (for example, quartz ($SiO_2$) or silicon carbide (SiC)) and is formed in a cylindrical shape of which upper end is closed and of which lower end is opened. A manifold (inlet flange) 209 is arranged under the reaction tube 203 to be concentric with the reaction tube 203. The manifold 209 is made of a metal, for example, a stainless steel (SUS) or the like and is formed in a cylindrical shape of which upper and lower ends are opened. An upper end portion of the manifold 209 is engaged with a lower end portion of the reaction tube 203, and thus, is configured so as to support the reaction tube 203. An O-ring 220a as a sealing member is provided between the manifold 209 and the reaction tube 203. By allowing the manifold 209 to be supported by a heater base, the reaction tube 203 is in a vertically installed state. A processing container (reaction container) is mainly configured with the reaction tube 203 and the manifold 209. A processing chamber 201 is formed in a cylindrical hollow portion of the processing container.

The processing chamber 201 is configured so as to be capable of accommodating the wafers 200 as the substrates in the state that multiple stages of the wafers in a horizontal posture are arranged in the vertical direction by a later-described boat 217.

Nozzles 410, 420, and 430 are provided in the processing chamber 201 so as to penetrate a side wall of the manifold 209. Gas supply pipes 310, 320, and 330 as gas supply lines are connected to the nozzles 410, 420, and 430, respectively. In this manner, the three nozzles 410, 420, and 430 and the three gas supply pipes 310, 320, and 330 are provided to the processing furnace 202, so that plural types of gases, herein, three types of gases (processing gases, source gases) can be configured so as to be individually supplied to the processing chamber 201.

Mass flow controllers (MFCs) 312, 322, and 332 that are flow rate controllers (flow rate control units) and valves 314, 324, and 334 that are opening/closing valves are provided to the gas supply pipes 310, 320, and 330, respectively, in the order from the upstream side. Gas supply pipes 510, 520, and 530 of supplying inert gases are connected to the downstream sides of the valves 314, 324, and 334 of the gas supply pipes 310, 320, and 330, respectively. MFCs 512, 522, and 532 that are flow rate controllers (flow rate control units) and valves 514, 524, and 534 that are opening/closing valves are provided to the gas supply pipes 510, 520, and 530, respectively, in the order from the upstream side.

The nozzles 410, 420, and 430 are coupled with (connected to) distal ends of the gas supply pipes 310, 320, and 330. The nozzles 410, 420, and 430 are configured as L-shaped long nozzles, and horizontal portions thereof are provided so as to penetrate the side wall of the manifold 209. The vertical portion of each of the nozzles 410, 420, and 430 is provided in a ring-shaped space formed between an inner wall of the reaction tube 203 and the wafer 200 so as to erect upwards (upwards in the loading direction of the wafer 200) along the inner wall of the reaction tube 203 (namely, so as to erect from one end side of the wafer arrangement region toward the other end side). Namely, each of the nozzles 410, 420, and 430 is provided at the side of a wafer arrangement region where the wafers 200 are arranged in a region horizontally surrounding the wafer arrangement region so as to extend along the wafer arrangement region.

Gas supply holes 410$a$, 420$a$, and 430$a$ of supplying (ejecting) gases are provided to the respective side surfaces of the nozzles 410, 420, and 430. The gas supply holes 410$a$, 420$a$, and 430$a$ are opened so as to be directed toward the center of the reaction tube 203. A plurality of the gas supply holes 410$a$ (420$a$, 430$a$) are provided over the range of the lower portion and the upper portion of the reaction tube 203, and the plurality of the gas supply holes have the same opening area and are provided with the same opening pitch.

In this manner, in the gas supplying method according to the embodiment, the gas is carried through the nozzles 410, 420, and 430 arranged in a ring-shaped elongated space defined by an inner wall of the reaction tube 203 and the edge portion of the plural laminated wafers 200, that is, a cylindrical shape as viewed from a plane. The gas is ejected from the gas supply holes 410$a$, 420$a$, and 430$a$ opened in the respective nozzles 410, 420, and 430 into the reaction tube 203 first in the vicinity of the wafers 200. The main flow of the gas in the reaction tube 203 is directed in the direction parallel to the surface of the wafers 200, that is, in the horizontal direction. By such a configuration, the gas can be uniformly supplied to each wafer 200, so that it is possible to obtain the effect of enabling a thickness of a film formed on each wafer 200 to be uniform. Although the gas flowed on the surface of each wafer 200, that is, the gas (remaining gas) remaining after the reaction is flowed in the direction toward the exhaust outlet, that is, the direction of the later-described exhaust pipe 231, the direction of the flow of the remaining gas is appropriately specified according to the position of the exhaust outlet, but it not limited to the vertical direction.

As an example of the above-described configuration, a source gas as a processing gas is supplied from the gas supply pipe 310 through the MFC 312, the valve 314, and the nozzle 410 to the processing chamber 201. As the source gas, for example, a gas (metal-containing gas) containing a metal element that is a halogen-based source gas (halogen compound, halide) can be used. As the metal element, for example, tungsten hexafluoride ($WF_6$) gas that is a tungsten (W)-containing source (W-containing source gas, W-containing gas, W source) containing tungsten (W) is used. In this specification, the case of using the term "source" includes a case where the source denotes a "liquid source in a liquid state", a case where the source denotes a "source gas in a gas state", or the case the source denotes both thereof.

A first reducing gas as a processing gas is supplied from the gas supply pipe 320 through the MFC 322, the valve 324, and the nozzle 420 to the processing chamber 201. As the first reducing gas, a boron (B)-containing gas (B source) containing boron (B), for example, diborane ($B_2H_6$) is used.

A second reducing gas as a processing gas is supplied from the gas supply pipe 330 through the MFC 332, the valve 334, and the nozzle 430 to the processing chamber 201. As the second reducing gas, a hydrogen (H)-containing gas containing hydrogen (H) and not containing other elements, for example, a hydrogen ($H_2$) gas is used.

For example, a nitrogen ($N_2$) gas as an inert gas is supplied from the carrier gas supply pipes 510, 520, and 530 through the respective MFCs 512, 522, and 532, the respective valves 514, 524, and 534, and the respective the nozzles 410, 420, and 430 to the processing chamber 201.

In case of flowing the above-described processing gas from the gas supply pipes 310, 320, and 330, a processing gas supply system is mainly configured with the gas supply pipes 310, 320, and 330, the MFCs 312, 322, and 332, and the valves 314, 324, and 334. It may be considered that the nozzles 410, 420, and 430 are included in the processing gas supply system. The processing gas supply system may be simply referred to as a gas supply system.

In case of flowing a source gas as a processing gas from the gas supply pipe 310, a source gas supply system is mainly configured with the gas supply pipe 310, the MFC 312, and the valve 314. It may be considered that the nozzle 410 is included in the source gas supply system. In case of flowing a halogen-based source gas as a source gas from the gas supply pipe 310, the source gas supply system may be referred to as a halogen-based source gas supply system. In case of flowing a metal-containing gas as a halogen-based source gas from the gas supply pipe 310, the halogen-based source gas supply system may be referred to as a metal-containing gas supply system. In case of flowing a W-containing gas from the gas supply pipe 310, the metal-containing gas supply system may be referred to as a W-containing gas supply system. In case of flowing a $WF_6$ gas from the gas supply pipe 310, the W-containing gas supply system may be referred to as a $WF_6$ gas supply system. The $WF_6$ gas supply system may be referred to as a $WF_6$ supply system.

In case of flowing the above-described reducing gas from the gas supply pipes 320 and 330, a reducing gas supply system is mainly configured with the gas supply pipes 320 and 330, the MFCs 322 and 332, and the valves 324 and 334. It maybe considered that the nozzles 420 and 430 are included in the reducing gas supply system. The reducing gas supply system may be simply referred to as a gas supply system.

In case of flowing a first reducing gas as a reducing gas from the gas supply pipe 320, a first reducing gas supply system is mainly configured with the gas supply pipe 320, the MFC 322, and the valve 324. It may be considered that the nozzle 420 is included in the first reducing gas supply system. In case of flowing a B-containing gas as a first reducing gas from the gas supply pipe 320, the first reducing gas supply system may be referred to as a B-containing gas supply system. In case of flowing a $B_2H_6$ gas from the gas supply pipe 320, the B-containing gas supply system may be referred to as a $B_2H_6$ gas supply system. The $B_2H_6$ gas supply system may be referred to as a $B_2H_6$ supply system.

In case of supplying a second reducing gas as a reducing gas from the gas supply pipe 330, a second reducing gas supply system is mainly configured with the gas supply pipe 330, the MFC 332, and the valve 334. It may be considered that the nozzle 430 is included in the second reducing gas supply system. In case of flowing an H-containing gas as a second reducing gas from the gas supply pipe 330, the second reducing gas supply system may be referred to as an H-containing gas supply system. In case of using an $H_2$ gas as an H-containing gas, the H-containing gas supply system may be referred to as an $H_2$ gas supply system. The $H_2$ gas supply system may be referred to as an $H_2$ supply system.

In addition, an inert gas supply system is mainly configured with the gas supply pipes 510, 520, and 530, the MFCs 512, 522, and 532, and the valves 514, 524, and 534. Since the inert gas functions as a purging gas, a dilution gas, a carrier gas, or the like, the inert gas supply system may be referred to as a purging gas supply system, a dilution gas supply system, or a carrier gas supply system.

The exhaust pipe 231 exhausting the atmosphere in the processing chamber 201 is provided to the manifold 209. A pressure sensor 245 that is a pressure detector (pressure detection unit) which detects the pressure of the inner portion of the processing chamber 201, an APC (Auto Pressure Controller) valve 243 that is a pressure controller (pressure control unit) which controls the pressure of the inner portion of the processing chamber 201, and a vacuum pump 246 that is a vacuum exhaustion apparatus are connected to the exhaust pipe 231 in the order from the upstream side. The APC valve 243 is a valve configured so as to regulate the pressure of the inner portion of the processing chamber 201 by opening and closing the valve in the state that the vacuum. pump 246 is operated. An exhaust system, that is, an exhaust line is mainly configured with the exhaust pipe 231, the APC valve 243, and the pressure sensor 245. In addition, it may be considered that the vacuum pump 246 is included in the exhaust system. In addition, it may be considered that a trap device or a detoxifying device is included in the exhaust system.

A seal cap 219 as a furnace opening lid body capable of hermetically closing a lower-end opening of the manifold 209 is provided under the manifold 209. The seal cap 219 is configured so as to be in contact with the lower end of the manifold 209 from the lower side in the vertical direction. The seal cap 219 is made of, for example, a metal such as SUS and is formed in a disk shape. An O-ring 220b as a sealing member being in contact with the lower end of the manifold 209 is provided on a top surface of the seal cap 219. A rotation mechanism 267 rotating the later-described boat 217 is provided to the side of the seal cap 219 opposite to the processing chamber 201. A rotation shaft 255 of the rotation mechanism 267 penetrates the seal cap 219 to be connected to the boat 217. The rotation mechanism 267 is configured to rotate the wafers 200 by rotating the boat 217. The seal cap 219 is configured so as to lift up and down in the vertical direction by a boat elevator 115 as a lifting mechanism provided vertically outside the reaction tube 203. The boat elevator 115 is configured to be capable of loading and unloading the boat 217 into and from the processing chamber 201 by lifting up and down the seal cap 219. The boat elevator 115 is configured as a carrying unit (carrying mechanism) of carrying the boat 217, that is, the wafers 200 into and from the processing chamber 201. In addition, a shutter (not shown) as a furnace opening lid body capable of hermetically closing the lower-end opening of the manifold 209 during the lifting down of the seal cap 219 by the boat elevator 115 is provided under the manifold 209. The shutter is made of, for example, a metal such as SUS and is formed in a disk shape. An O-ring (not shown) as a sealing member being in contact with the lower end of the manifold 209 is provided on a top surface of the shutter. Opening and closing operations (lifting up and down operations or rotating operation) of the shutter are controlled by a shutter opening/closing mechanism (not shown).

The boat 217 as a substrate supporting jig is configured so as to support multiple stages of the plural wafers, for example, 25 to 200 wafers 200 to be in a horizontal posture and to be arranged in the vertical direction in that state that the centers of the wafers are aligned with one another, namely, to arrange the wafers to be spaced with an interval. The boat 217 is made of, for example, a heat resistant material such as quartz or SiC. A heat-insulating cylinder 218 configured as a cylindrical member made of, for example, a heat resistant material such as quartz or SiC is provided under the boat 217. By this configuration, heat from the heater 207 is not easily transmitted to the seal cap 219 side. However, the embodiment is not limited to the above-described form. For example, the heat-insulating cylinder 218 is not provided under the boat 217, but multiple stages of heat-insulating plates made of a heat resistant material such as quartz or SiC may be provided so as to be supported in a horizontal posture.

A temperature sensor 263 as a temperature detector is provided inside the reaction tube 203. By adjusting an electric conduction amount to the heater 207 based on temperature information detected by the temperature sensor 263, the temperature of the processing chamber 201 is configured so as to be in a desired temperature distribution. The temperature sensor 263 is configured in an L shape similarly to the nozzles 410, 420, and 430 and is provided along the inner wall of the reaction tube 203.

Figure 3:
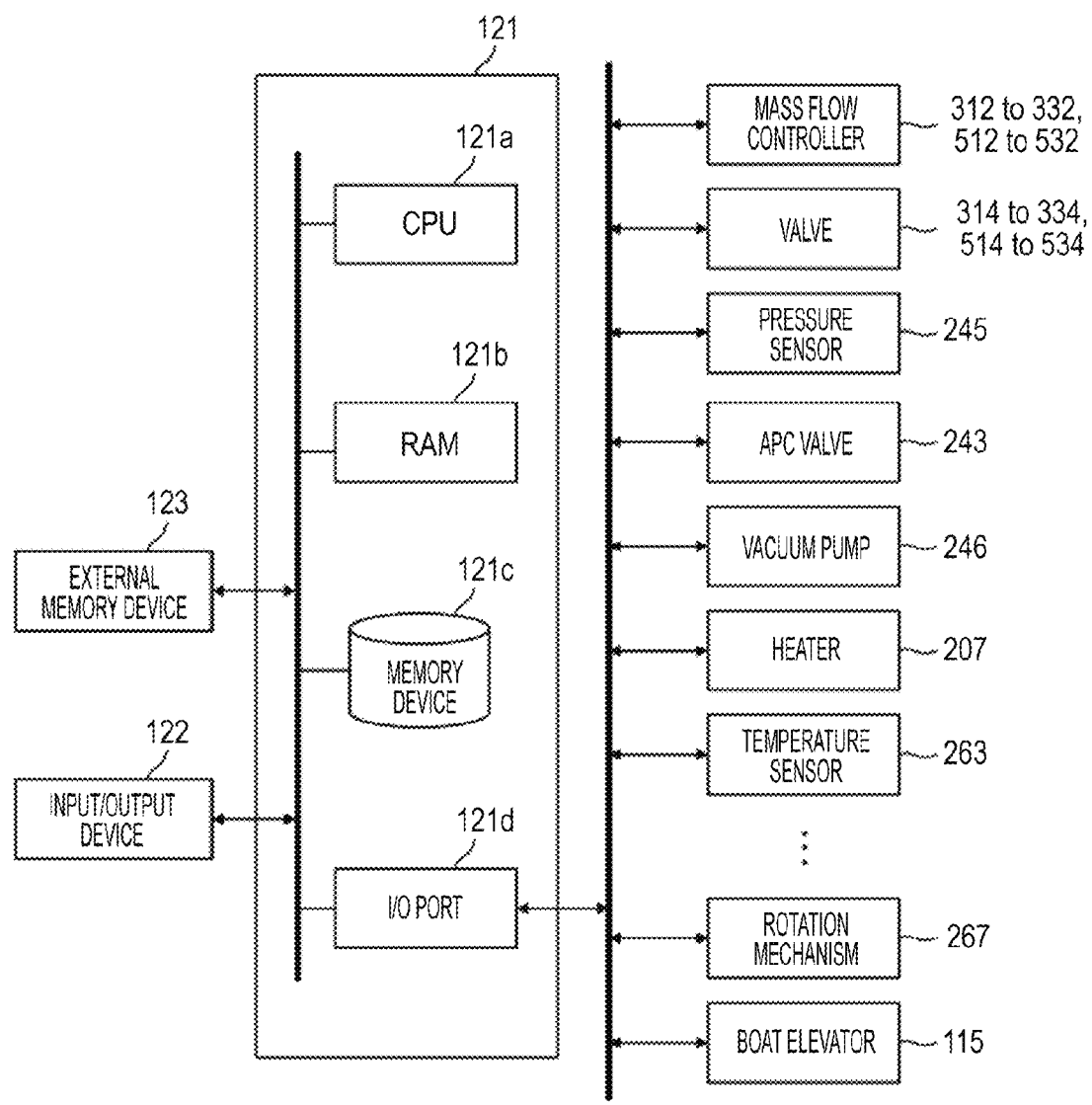
FIG. 3 is a block diagram illustrating a configuration of a controller included in the substrate processing apparatus illustrated in FIG. 1.

As illustrated in FIG. 3, a controller 121 that is a control unit is configured as a computer including a CPU (Central Processing Unit) 121a, a RAM (Random Access Memory) 121b, a memory device 121c, and an I/O port 121d. The RAM 121b, the memory device 121c, and the I/O port 121d are configured to be capable of exchanging data with the CPU 121a via an internal bus 121e. An input/output device 122 configured as, for example, a touch panel or the like is connected to the controller 121.

The memory device 121c is configured with, for example, a flash memory, an HDD (hard disk drive), or the like. A control program controlling operations of the substrate processing apparatus, a process recipe, and the like describing procedures or conditions of a film forming process described later are readably stored in the memory device 121c. The process recipe is a combination of procedures in the later-described film forming process so as to obtain a predetermined result by allowing the controller 121 to execute the procedures and functions as a program. Hereinafter, the process recipe, the control program, and the like are also collectively simply referred to as a program. In addition, the process recipe is also simply referred to as a recipe. In this specification, as the case of using the term "program", there is a case including only the recipe alone, a case including only the control program alone, or a case including both thereof. The RAM 121b is configured as a memory area (work area) temporarily retaining a program, data, and the like read out by the CPU 121a.

The I/O port 121d is connected to the MFCs 312, 322, 332, 512, 522, and 532, the valves 314, 324, 334, 514, 524, and 534, the APC valve 243, the pressure sensor 245, the vacuum pump 246, the heater 207, the temperature sensor 263, the rotation mechanism 267, the boat elevator 115, and the like described above.

The CPU 121a is configured so as to execute reading the control program from the memory device 121c and so as to read out the recipe from the memory device 121c according to input or the like of a manipulation command from the input/output device 122. The CPU 121a is configured so as to control, according to contents of the read recipe, flow rate regulating operations for various gases by the MFCs 312, 322, 332, 512, 522, and 532, opening/closing operations of the valves 314, 324, 334, 514, 524, and 534, opening/closing operations of the APC valve 243, a pressure regulating operation of the APC valve 243 based on the pressure sensor 245, an adjusting operation of the temperature of the heater 207 based on the temperature sensor 263, activating and stopping of the vacuum pump 246, an adjusting operation of the rotation and rotation speed of the boat 217 by the rotation mechanism 267, lifting up/down operations of the boat 217 by the boat elevator 115, and the like.

The controller 121 may be configured to install the above-described program stored in an external memory device (for example, a magnetic tape, a magnetic disk such as a flexible disk or a hard disk, an optical disk such as a CD or a DVD, a magneto-optical disk such as an MO, or a semiconductor memory such as a USB memory or a memory card) 123 in the computer. The memory device 121c and the external memory device 123 are configured as a computer-readable recording medium. Hereinafter, these are also collectively simply referred to as a recording medium. In this specification, as the case of using the term "recording medium", there is a case including only the memory device 121c alone, a case including only the external memory device 123, or a case including both thereof. In addition, supplying the program to the computer may be performed by using a communication unit such as the Internet or a private line without using the external memory device 123.

(2) Substrate Process

As one of the processes of manufacturing a semiconductor device, a first embodiment of a process of forming, for example, a metal film on the substrate will be described with reference to FIG. 6. The process of forming the metal film is performed by using the processing furnace 202 of the above-described substrate processing apparatus 10. In the description hereinafter, operations of components constituting the substrate processing apparatus 10 are controlled by the controller 121.

In an appropriate film formation sequence (sometimes, simply referred to as a sequence) according to the embodiment, performed are:

a process of reducing a plurality of conductive films exposed on a wafer 200 by supplying a first reducing gas (for example, $B_2H_6$ gas) to the wafer 200 where an insulating film (for example, an SiO film) and the plurality of the conductive films (for example, a Cu film, a Ta film, and a TaN film) having different incubation times are exposed to a surface thereof and by adjusting a process condition of the first reducing gas so that a difference in incubation time among the plurality of the conductive films is 0.01% or more and 50% or less; and a process of selectively forming a metal film (for example, a W film) on the plurality of the reduced conductive films by supplying a second reducing gas (for example, an $H_2$ gas) and a metal-containing gas (for example, a $WF_6$ gas) to the wafer 200.

In the specification, a phrase "to perform a process (referred to as a process, a cycle, a step, or the like) a predetermined number of times" denotes that the process or the like is performed once or several times. Namely, the phrase denotes that the process is performed one or more times. FIG. 6 illustrates an example where a reducing gas flow process (cycle) is repeated n cycles. The number of times of performing each process or the like is appropriately selected according to a to-be-obtained reduction effect.

In addition, in the specification, in some cases, a case of using the term "wafer" may include a case of denoting a "wafer itself" and a case of denoting a "stacked body (aggregate) of a wafer and predetermined layers, films, or the like formed on a surface thereof". Namely, a wafer including predetermined layers, films, or the like formed on a surface thereof may be referred to as a wafer. In addition, in this specification, in some cases, a case of using the phrase "surface of a wafer" may include a case of denoting a "surface (exposed surface) of a wafer itself" or a case of denoting a "surface of a predetermined layer, film, or the like formed on a wafer, that is, an uppermost surface of a wafer as a stacked body".

Therefore, in this specification, in some cases, a case of expressing the phrase "to supply a predetermined gas to a wafer" may include a case of denoting "to directly supply a predetermined gas to a surface (exposed surface) of a wafer itself" or a case of denoting "to supply a predetermined gas to a layer, film, or the like formed on a wafer, that is, to an uppermost surface of a wafer as a stacked body". In addition, in this specification, in some cases, a case of expressing the phrase "to form a predetermined layer (or film) on a wafer" may include a case of denoting "to directly form a predetermined layer (or film) on a surface (exposed surface) of a wafer itself" or a case of denoting "to form a predetermined layer (or film) on a layer or film formed on a wafer, that is, on an uppermost surface of a wafer as a stacked body".

In addition, in this specification, a case of using the term "substrate" is the same as a case of using the term "wafer".

In the specification, "time-division" denotes to be temporally divided (separated). For example, in the specification, to perform each process in a time division manner denotes to perform each process in an asynchronous manner, namely, without synchronization. In other words, to perform each process in a time division manner denotes to perform each process intermittently (in a pulse manner). Namely, to perform each process in a time division manner denotes that processing gases supplied in the respective processes are supplied so as not to be mixed. In case of performing processes in a time division manner several times, the processing gases supplied to the respective processes are alternately supplied so as not to be mixed.

In addition, in the specification, the term "metal film" denotes a film (sometimes, simply referred to as a conductive film) made of a conductive material including a metal atom, and the metal film includes a conductive metal nitride film, a conductive metal oxide film, a conductive metal oxynitride film, a conductive metal oxycarbide film, a conductive metal composite film, a conductive metal alloy film, a conductive metal silicide film (metal silicide film), a conductive metal carbide film, a conductive metal carbonitride film, and the like. In addition, the W film (tungsten film) is a conductive metal film.

(Substrate Preparing Step)

If the plural wafers 200 are charged into the boat 217 (wafer-charged), a shutter is moved by a shutter opening/closing mechanism, and the lower-end opening of the manifold 209 is opened (shutter-opened). After that, as illustrated in FIG. 1, the boat 217 supporting the plural wafers 200 is lifted up by the boat elevator 115 to be inserted (boat-loaded) into the processing chamber 201. In this state, the seal cap 219 is in the state that the seal cap seals the lower end of the manifold 209 through the O-ring 220b.

(Pressure/Temperature Regulating Step)

Vacuum evacuation (pressure reducing evacuation) is performed by the vacuum pump 246 so that the processing chamber 201, that is, the space where the wafer 200 exists is at a desired pressure (degree of vacuum). At this time, the pressure of the processing chamber 201 is measured by the pressure sensor 245, and the APC valve 243 is feedback controlled based on the measured pressure information. The vacuum pump 246 maintains the state that the vacuum pump is operated at all time at least until the later-described film forming process is ended. In addition, the wafer 200 in the processing chamber 201 is heated by the heater 207 so as to be at a desired film forming temperature. At this time, the state of electric conduction to the heater 207 is feedback controlled based on the temperature information detected by the temperature sensor 263 so that the processing chamber 201 has a desired temperature distribution. The heating of the processing chamber 201 by the heater 207 continues to be performed at least until the later-described film forming process is ended. In addition, the rotation of the boat 217 and the wafer 200 by the rotation mechanism 267 is started. The rotation of the boat 217 and the wafer 200 by the rotation mechanism 267 continues to be performed at least until the later-described film forming process is ended.

(Reduction Step)

Subsequently, a reduction step illustrated in FIG. 6 will be described. The reduction step includes a $B_2H_6$ gas supplying step and a remaining gas removing step described hereinafter.

($B_2H_6$ Gas Supplying Step)

The valve 324 is opened, so that the $B_2H_6$ gas as the first reducing gas is flowed in the gas supply pipe 320. The $B_2H_6$ gas flowed through the gas supply pipe 320 is flow-rate-regulated by the MFC 322 to be supplied from the gas supply hole 420a of the nozzle 420 to the processing chamber 201 and is exhausted from the exhaust pipe 231.

At this time, the $B_2H_6$ gas is supplied to the wafer 200 where the SiO film and the Cu film, the Ta film, and the TaN film having different incubation times are exposed to the surface thereof. Namely, the surface of the wafer 200 is exposed to the $B_2H_6$ gas. At the same time, the valve 524 is opened, so that the $N_2$ gas is flowed through the carrier gas supply pipe 520. The $N_2$ gas flowed through the carrier gas supply pipe 520 is flow-rate-regulated by the MFC 522 to be supplied together with the $B_2H_6$ gas to the processing chamber 201 and is exhausted from the exhaust pipe 231. At this time, in order to prevent the infiltration of the $B_2H_6$ gas into the nozzles 410 and 430, the valve 514 and 534 are opened, so that the $N_2$ gas is flowed through the carrier gas supply pipes 510 and 530. The $N_2$ gas is supplied through the gas supply pipes 310 and 330 and the nozzles 410 and 430 to the processing chamber 201 and is exhausted from the exhaust pipe 231.

At this time, by appropriately regulating the APC valve 243, the pressure of the inner portion of the processing chamber 201 is set to, for example, a pressure (predetermined) in a range of 10 to 3000 Pa, preferably, a pressure (predetermined) in a range of 30 to 1000 Pa, more preferably, a pressure (predetermined) in a range of 400 to 600 Pa. If the pressure of the inner portion of the processing chamber 201 is higher than 3000 Pa, there is a possibility that the $B_2H_6$ gas is over-supplied, and thus, the reduction effect occurs on the SiO film, and the incubation time of the SiO film becomes equivalent to the incubation times of the Ta film, the TaN film, and the Cu film, so that the selectivity in the later-described W film forming step is broken, and thus, the W film is prominently formed on the SiO film, and there is a possibility that the later-described remaining gas removing is not sufficiently performed and the effect of removing incompletely decomposed $B_2H_6$ (by-products, intermediate body) is decreased. If the pressure of the inner portion of the processing chamber 201 is lower than 10 Pa, there is a possibility that a sufficient reduction effect of the $B_2H_6$ gas cannot be obtained. In addition, in the specification, as a range of numerical values, for example, a case where 10 to 3000 Pa is written denotes that the value is 10 Pa or more and 3000 Pa or less. Namely, the range of numerical values includes 10 Pa and 3000 Pa. The same description is applied to all the numerical values such as flow rate, time, and temperature as well as the pressure disclosed in the specification.

The supply flow rate of the $B_2H_6$ gas controlled by the MFC 322 is set, for example, to be a flow rate (predetermined) in a range of 0.01 to 1 slm, preferably, to be a flow rate (predetermined) in a range of 0.05 to 0.5 slm, for example, to be a flow rate (predetermined) in a range of 0.1 to 0.3 slm. If the flow rate of the $B_2H_6$ gas is larger than 1 slm, there is a possibility that the $B_2H_6$ gas is over-supplied, and thus, the reduction effect occurs on the SiO film, and the incubation time of the SiO film becomes equivalent to the incubation times of the Ta film, the TaN film, and the Cu film, so that the selectivity in the later-described W film forming step is broken, and thus, the W film is prominently formed on the SiO film. If the flow rate of the $B_2H_6$ gas is smaller than 0.01 slm, there is a possibility that the sufficient reduction effect cannot be obtained.

The supply flow rate of the $N_2$ gas controlled by each of the MFCs 512, 522, and 532 is set, for example, to be a flow rate (predetermined) in a range of 0.01 to 30 slm, preferably, to be a flow rate (predetermined) in a range of 0.1 to 10 slm, for example, to be a flow rate (predetermined) in a range of 1 to 5 slm. If the flow rate of the $N_2$ gas is larger than 30 slm, there is a possibility that a sufficient reduction effect of the $B_2H_6$ gas cannot be obtained. If the flow rate of the $N_2$ gas is smaller than 0.01 slm, there is a possibility that the effect of removing incompletely decomposed $B_2H_6$ (by-products, intermediate body) is decreased.

In addition, the partial pressure of the $B_2H_6$ gas is set to be, for example, a value (predetermined) in a range of 1 to 10 Pa, preferably, a value (predetermined) in a range of 2 to 8 Pa, more preferably, a value (predetermined) in a range of 3 to 6 Pa. If the partial pressure of the $B_2H_6$ gas is higher than 10 Pa, there is a possibility that the $B_2H_6$ gas is over-supplied, and thus, the reduction effect occurs on the SiO film, and the incubation time of the SiO film becomes equivalent to the incubation times of the Ta film, the TaN film, and the Cu film, so that the selectivity in the later-described W film forming step is broken, and thus, the W film is prominently formed on the SiO film, and there is a possibility that the later-described remaining gas removing is not sufficiently performed and the effect of removing incompletely decomposed $B_2H_6$ (by-products, intermediate body) is decreased. If the partial pressure of the $B_2H_6$ gas is lower than 1 Pa, there is a possibility that a sufficient reduction effect of the $B_2H_6$ gas cannot be obtained.

The time taken to supply the $B_2H_6$ gas to the wafer 200, that is, the gas supply time (irradiation time) is set to be, for example, a time (predetermined) in a range of 0.01 to 10 minutes, preferably, a time (predetermined) in a range of 0.1 to 5 minutes, for example, a time (predetermined) in a range of 0.8 to 1.2 minutes. If the gas supply time is longer than 10 minutes, there is a possibility that the $B_2H_6$ gas is over-supplied, and thus, the reduction effect occurs on the SiO film, and the incubation time of the SiO film becomes equivalent to the incubation times of the Ta film, the TaN film, and the Cu film, so that the selectivity in the later-described W film forming step is broken, and thus, the W film is prominently formed on the SiO film, and there is a possibility that the later-described remaining gas removing is not sufficiently performed and the effect of removing incompletely decomposed $B_2H_6$ (by-products, intermediate body) is decreased. If the gas supply time is shorter than 0.01 minutes, there is a possibility that the sufficient reduction effect cannot be obtained.

At this time, the temperature of the heater 207 is set to be a temperature where the temperature of the wafer 200 becomes, for example, a temperature (predetermined) in a range of 200 to 300° C., preferably, a temperature (predetermined) in a range of 230 to 275° C., for example, a temperature (predetermined) in a range of 245 to 255° C. If the temperature of the heater 207 is higher than 300° C., there is a possibility that thermal decomposition of the $B_2H_6$ gas is facilitated, and thus, B is polymerized, and there is a possibility that the gas is over-supplied, and thus, the reduction effect occurs on the SiO film, and the incubation time of the SiO film becomes equivalent to the incubation times of the Ta film, the TaN film, and the Cu film, so that the selectivity in the later-described W film forming step is broken, and thus, the W film is prominently formed on the SiO film. If the temperature of the heater 207 is lower than 200° C., the reactivity of the $B_2H_6$ gas is decreased, and thus, there is a possibility that the effect of the reduction effect cannot be obtained. The gases flowed in the processing chamber 201 are only the $B_2H_6$ gas and the $N_2$ gas, and thus, by supplying the $B_2H_6$ gas, the $B_2H_6$ is preferentially adsorbed on the uppermost surface of the wafer 200 (base film of the surface), particularly, on the Ta film, the TaN film, and the Cu film, so that the $B_2H_6$-containing layer is formed.

The $B_2H_6$-containing layer includes a discontinuous adsorbing layer as well as a continuous adsorbing layer configured with $B_2H_6$ molecules. Namely, the $B_2H_6$-containing layer includes an adsorbing layer having a thickness of one-molecule layer or less than the thickness one-molecule layer configured with a $B_2H_6$ molecule (including an intermediate by-product (sometimes referred to as an intermediate body) of the $B_2H_6$ molecule). In addition, the $B_2H_6$-containing layer may be referred to as a B-containing layer.

In addition, a supply amount of the $B_2H_6$ gas to the wafer 200 (an exposure amount of the $B_2H_6$ gas or a reaction amount of the $B_2H_6$ gas with respect to the wafer 200) is represented by a product of the partial pressure of the $B_2H_6$ gas in the region where the wafer 200 exists (for example, the above-described processing chamber 201) and the time taken to supply the $B_2H_6$ gas to the wafer 200 at the temperature of the $B_2H_6$ gas. It is preferable that, in order to equalize the incubation times of the Ta film, the TaN film, and the Cu film, adjustment is performed so that the product of the process conditions of the partial pressure and the time at a predetermined temperature becomes a predetermined value.

(Remaining Gas Removing Step)

After the $B_2H_6$-containing layer is formed on the uppermost layer of the wafer 200 (base film of a surface), the valve 324 is closed, so that the supply of the $B_2H_6$ gas is stopped. At this time, the APC valve 243 is maintained opened, so that the processing chamber 201 is vacuum-exhausted by the vacuum pump 246, and the unreacted or incompletely decomposed $B_2H_6$ gas (by-products, intermediate body) remaining in the processing chamber 201 is removed from the processing chamber 201. Namely, the $B_2H_6$ gas remaining in the space where the wafer 200 adsorbed with $B_2H_6$ exists is removed. At this time, the valves 514, 524, and 534 are maintained opened, so that the supply of the $N_2$ gas to the processing chamber 201 is maintained. The $N_2$ gas functions as a purging gas, and thus, the effect of removing the unreacted or incompletely decomposed $B_2H_6$ gas (by-products, intermediate body) remaining in the processing chamber 201 from the processing chamber 201 can be improved.

At this time, the gas remaining in the processing chamber 201 may not be completely removed, and the processing chamber 201 may not be completely purged. If the gas remaining in the processing chamber 201 is very small, no adverse effect occurs in the step performed subsequently. There is no need to set the flow rate of the $N_2$ gas supplied to the processing chamber 201 to be a large flow rate, and for example, by supplying the $N_2$ gas of which amount is approximately equal to the volume of the reaction tube 203 (processing chamber 201), the purging can be performed to such an extent that no adverse effects occurs in the subsequent step. In this manner, the processing chamber 201 is not completely purged, so that the purge time is shortened, and it is possible to improve the throughput. It is possible to suppress the consumption of the $N_2$ gas to a necessary minimum.

(Performing Predetermined Number of Times)

A cycle of sequentially performing the above-described $B_2H_6$ gas supplying step and the above-described remaining gas removing step in a time division manner (asynchronously, namely, without synchronization) is set as one cycle, and the processes are performed by n cycles (n is an integer of 1 or more), so that the $B_2H_6$ is preferentially adsorbed on the Ta film, the TaN film, and the Cu film formed on the surface of the wafer 200, and thus, a $B_2H_6$-containing layer is formed. It is preferable that the above-described cycle is repeated several times.

By performing the reduction step, it is possible to equalize the incubation times of the Ta film, the TaN film, and the Cu film formed on the surface of the wafer 200. For example, the difference in incubation time among the Ta film, the TaN film, and the Cu film is set to be a value (predetermined) in a range of 0.01 to 50%, preferably, a value (predetermined) in a range of 10 to 30%, more preferably, a value (predetermined) in a range of 1 to 3%. If the difference in incubation time among the Ta film, the TaN film, and the Cu film is larger than 50%, there is a possibility that film thicknesses of the W films preferentially grown on the conductive films (the Ta film, the TaN film, and the Cu film) in the later-described W film forming step are different from each other on the Ta film, the TaN film, and the Cu film, and thus, it is difficult to selectively grow the W films uniformly on the conductive films, so that the W films are abnormally grown to be in a protruding shape. It is preferable that the difference in incubation time among the Ta film, the TaN film, and the Cu film is as small as possible. However, if the difference in incubation time is to be smaller than 0.01%, there is a possibility that a $B_2H_6$ adsorbing layer is also prominently formed on the SiO film as an insulating film, and thus, the selectivity is broken.

(After-Purging Step)

After the TiN film having a predetermined film thickness is formed, the valves 514, 524, and 534 are opened, so that the $N_2$ gas is supplied from the respective gas supply pipes 510, 520, and 530 to the processing chamber 201 and is exhausted from the exhaust pipe 231. The $N_2$ gas functions as a purging gas, so that the inner portion of the processing chamber 201 is purged by the inert gas, and thus, the gas or by-products remaining in the processing chamber 201 is removed from the processing chamber 201 (after-purging).

(W Film Forming Step)

Subsequently, a W film forming step of forming a W film as a metal film illustrated in FIG. 6 will be described. The W film forming step includes a $WF_6$ gas and $H_2$ gas supplying step and a remaining gas removing step described hereinafter.

($WF_6$ Gas and $H_2$ Gas Supplying Step)

The valve 314 is opened, so that the $WF_6$ gas as a source gas is flowed through the gas supply pipe 310. At the same time, the valve 334 is opened, so that the $H_2$ gas as a second reducing gas is flowed through the gas supply pipe 330. The $WF_6$ gas flowed through the gas supply pipe 310 is flow-rate-regulated by the MFC 312 to be supplied from the gas supply hole 410a of the nozzle 410 to the processing chamber 201 and is exhausted from the exhaust pipe 231. The $H_2$ gas flowed through the gas supply pipe 330 is flow-rate-regulated by the MFC 332 to be supplied from the gas supply hole 430a of the nozzle 430 to the processing chamber 201 and is exhausted from the exhaust pipe 231.

At this time, the $WF_6$ gas and the $H_2$ gas in a mixed state are supplied to the wafer 200. Namely, the surface of the wafer 200 is exposed to the atmosphere where the $WF_6$ gas and the $H_2$ gas are mixed. At the same time, the valves 514 and 534 are opened, so that the $N_2$ gas is flowed through the carrier gas supply pipes 510 and 530. The $N_2$ gas flowed through the carrier gas supply pipes 510 and 530 are flow-rate-regulated by the MFCs 512 and 532 to be supplied together with the $WF_6$ gas or the $H_2$ gas to the processing chamber 201 and is exhausted from the exhaust pipe 231. At this time, in order to prevent infiltration (backflow) of the $WF_6$ gas or the $H_2$ gas in the nozzle 420, the valve 524 is opened, so that the $N_2$ gas is flowed through the carrier gas supply pipe 520. The $N_2$ gas is supplied through the gas supply pipe 320 and the nozzle 420 to the processing chamber 201 and is exhausted from the exhaust pipe 231.

At this time, by appropriately regulating the APC valve 243, the pressure of the inner portion of the processing chamber 201 is set to, for example, a pressure (predetermined) in a range of 0.01 to 1300 Pa, preferably, a pressure (predetermined) in a range of 0.1 to 500 Pa, more preferably, a pressure (predetermined) in a range of 1 to 250 Pa. If the pressure of the inner portion of the processing chamber 201 is higher than 1300 Pa, there is a possibility that the $WF_6$ gas is decomposed, and the decomposed materials are polymerized on the surface of the substrate or in a gas phase, and thus, the selectivity is broken (selectivity cannot be taken), and the later-described remaining gas removing is not sufficiently performed, so that by-products are incorporated into the film. If the pressure of the inner portion of the processing chamber 201 is lower than 0.01 Pa, there is a possibility that a sufficient reaction speed of the $WF_6$ gas cannot be obtained (namely, a predetermined film forming rate cannot be obtained).

The supply flow rate of the $WF_6$ gas controlled by the MFC 312 is set, for example, to be a flow rate (predetermined) in a range of 0.001 to 3 slm, preferably, to be a flow rate (predetermined) in a range of 0.001 to 1 slm, for example, to be a flow rate (predetermined) in a range of 0.05 to 0.2 slm. If the supply flow rate of the $WF_6$ gas is larger than 3 slm, there is a possibility that the $WF_6$ gas is over-supplied, and thus, the selectivity is broken (selectivity cannot be obtained). If the supply flow rate of the $WF_6$ gas is smaller than 0.001 slm, there is a possibility that the sufficient reaction speed of the $WF_6$ gas is not obtained (namely, a predetermined film forming rate is not obtained).

The supply flow rate of the $H_2$ gas controlled by the MFC 332 is set, for example, to be a flow rate (predetermined) in a range of 0.01 to 200 slm, preferably, to be a flow rate (predetermined) in a range of 0.1 to 100 slm, for example, to be a flow rate (predetermined) in a range of 7 to 50 slm. If the supply flow rate of the $H_2$ gas is larger than 200 slm, there is a possibility that the heat of the wafer 200 is lost by the $H_2$ gas, and thus, the reaction of the $WF_6$ gas and the $H_2$ gas becomes non-uniform, so that in-plane uniformity is deteriorated. If the supply flow rate of the $H_2$ gas is smaller than 0.01 slm, there is a possibility that the $WF_6$ gas is over-supplied, so that the selectivity is broken (selectivity is not obtained). In addition, it is preferable that the flow rate of the $WF_6$ gas is 1/100 or less of the flow rate (volumetric flow rate) of the $H_2$ gas.

The supply flow rate of the $N_2$ gas controlled by each of the MFCs 512, 522, and 532 is set, for example, to be a flow rate (predetermined) in a range of 0.1 to 20 slm, preferably, to be a flow rate (predetermined) in a range of 0.5 to 15 slm, for example, to be a flow rate (predetermined) in a range of 1 to 10 slm. If the supply flow rate of the $N_2$ gas is larger than 20 slm, there is a possibility that sufficient reaction speeds of the $WF_6$ gas and the $H_2$ gas cannot be obtained (namely, a predetermined film forming rate cannot be obtained). If the supply flow rate of the $N_2$ gas is smaller than 0.1 slm, there is a possibility that decomposed materials of the $WF_6$ gas remain in surface of the wafer 200, so that the selectivity is deteriorated.

The time taken to supply the $WF_6$ gas and the $H_2$ gas to the wafer 200, that is, the gas supply time (irradiation time) is set to, for example, a time (predetermined) in a range of 1 to 200 minutes, preferably, a time (predetermined) in a range of 3 to 60 minutes, for example, a time (predetermined) in a range of 15 to 25 minutes. If the gas supply time is longer than 200 seconds, there is a possibility that the productivity is greatly decreased, and there is a possibility that the W film is also grown on the SiO film, so that the selectivity is broken (selectivity cannot be obtained). If the gas supply time is shorter than 1 minute, there is a possibility that sufficient reaction speeds of the $WF_6$ gas and the $H_2$ gas are not obtained (namely, a predetermined film thickness cannot be obtained).

At this time, the temperature of the heater 207 is set to be, a temperature where the temperature of the wafer 200 becomes, for example, a temperature (predetermined) in a range of 200 to 300° C., preferably, a temperature (predetermined) in a range of 230 to 275° C., for example, a temperature (predetermined) in a range of 245 to 255° C. It is preferable that the temperature is set to be the same as that of the $B_2H_6$ gas supplying step, because there is no need to change the temperature between the reduction step and the W film forming step, so that the throughput is improved. If the temperature of the heater 207 is higher than 300° C., there is a possibility that the $WF_6$ gas is over-supplied, and thus, the selectivity is broken (selectivity is not obtained). If the temperature of the heater 207 is lower than 200° C., there is a possibility that sufficient reaction speeds of the $WF_6$ gas and the $H_2$ gas are not obtained (namely, a predetermined film forming rate is not obtained). The gases flowed in the processing chamber 201 are only the $WF_6$ gas, the $H_2$ gas, and the $N_2$ gas, and the $WF_6$ gas and the $H_2$ gas are reacted in a gas phase (gas-phase reaction) or are reacted on the surface of the wafer 200, so that the W film is preferentially formed on the conductive films such as the Ta film, the TaN film, and the Cu film formed on the wafer 200. By controlling (adjusting) the process conditions such as supply flow rates, supply times, and the like of the $WF_6$ gas and the $H_2$ gas, the W film can be grown up to a desired film thickness. In addition, at this time, there is a case where, due to the reduction effect of a small amount of the adsorbed $B_2H_6$ gas, a small amount of an unintended W film may also be grown on the SiO film.

(Remaining Gas Removing Step)

After the W film is formed on the conductive films such as the Ta film, the TaN film, and the Cu film formed on the wafer 200, the valves 314 and 324 are closed, so that the supply of the $WF_6$ gas and the $H_2$ gas is stopped. At this time, the APC valve 243 is maintained opened, so that the processing chamber 201 is vacuum-exhausted by the vacuum pump 246, the unreacted or after-contribution-to-W-film-formation $WF_6$ and $H_2$ gases remaining in the processing chamber 201 are removed from the processing chamber 201. Namely, the $WF_6$ and $H_2$ gases remaining in the space where the wafer 200 on which the W film is formed exists are removed. At this time, the valves 514, 524, and 534 are maintained opened, so that the supply of the $N_2$ gas to the processing chamber 201 is maintained. The $N_2$ gas functions as a purging gas, and thus, the effect of removing the unreacted or after-contribution-to-W-film-formation $WF_6$ gas and $H_2$ gas remaining in the processing chamber 201 from the processing chamber 201 can be improved.

At this time, the gas remaining in the processing chamber 201 may not be completely removed, and the processing chamber 201 may not be completely purged. The gas remaining in the processing chamber 201 is very small, no adverse effect occurs in the step performed subsequently. When there is no need to set the flow rate of the $N_2$ gas supplied to the processing chamber 201 to be a large flow rate, and for example, by supplying the $N_2$ gas of which amount is approximately equal to the volume of the reaction tube 203 (processing chamber 201), the purging can be performed to such an extent that no adverse effects occurs in the subsequent step. In this manner, the processing chamber 201 is not completely purged, and thus, the purging time is shortened, so that the throughput can be improved. It is possible to suppress the consumption of the $N_2$ gas to a necessary minimum.

(After-Purging Step and Atmospheric Pressure Returning Step)

After the W film having a predetermined film thickness is formed, the $N_2$ gas is supplied from the respective gas supply pipes 510, 520, and 530 to the processing chamber 201 and is exhausted from the exhaust pipe 231. The $N_2$ gas functions as a purging gas, so that the inner portion of the processing chamber 201 is purged by the inert gas, and thus, the gas or by-products remaining in the processing chamber 201 is removed from the processing chamber 201 (after-purging). After that, the atmosphere in the processing chamber 201 is replaced with an inert gas (inert gas replacement), and the pressure of the inner portion of the processing chamber 201 is returned to the normal pressure (atmospheric pressure return).

(Unloading Step)

After that, the seal cap 219 is lifted down by the boat elevator 115 so that the lower end of the manifold 209 is opened, and the processed wafer 200 is unloaded (boat-unloaded) from the lower end of the manifold 209 to the outside of the reaction tube 203 in the state that the wafer is supported by the boat 217. After the boat unloading, the shutter 219s is moved, and the lower-end opening of the manifold 209 is sealed by the shutter 219s through the O-ring 220c (shutter-closing). The processed wafer 200 is unloaded to the outside of the reaction tube 203, and after that, the wafer is discharged from the boat 217 (wafer-discharging).

Before the reduction step, a thermal treatment (annealing) step may be performed. By performing the thermal treatment on the wafer 200 in advance, it is possible to further clean the surface of the wafer 200. The thermal treatment may be performed, for example, under an $H_2$ gas atmosphere by using the $H_2$ gas that is the above-described second reducing gas as the reducing gas. The thermal treatment is performed, for example, by setting the pressure of the processing chamber to be a pressure (predetermined) in a range of 500 to 1500 Pa and by flowing the $H_2$ gas at a supply flow rate (predetermined) in a range of 0.5 to 2 slm for a supply time (predetermined) in a range of 30 to 90 minutes.

After the W film forming step and before the after-purging, a (light) etchback step may be performed. Since there is a case where due to the reduction effect of a small amount of the adsorbed $B_2H_6$ gas, a small amount of an unintended W film may also be grown on the SiO film, the W film formed on the SiO film is removed by supplying an etching gas to the wafer 200. As the etching gas, for example, nitrogen trifluoride ($NF_3$) that is a fluorine (F)-containing gas as a halide or the like may be used. The etchback step may be performed by using a different substrate processing apparatus after wafer discharging.

Figure 6:
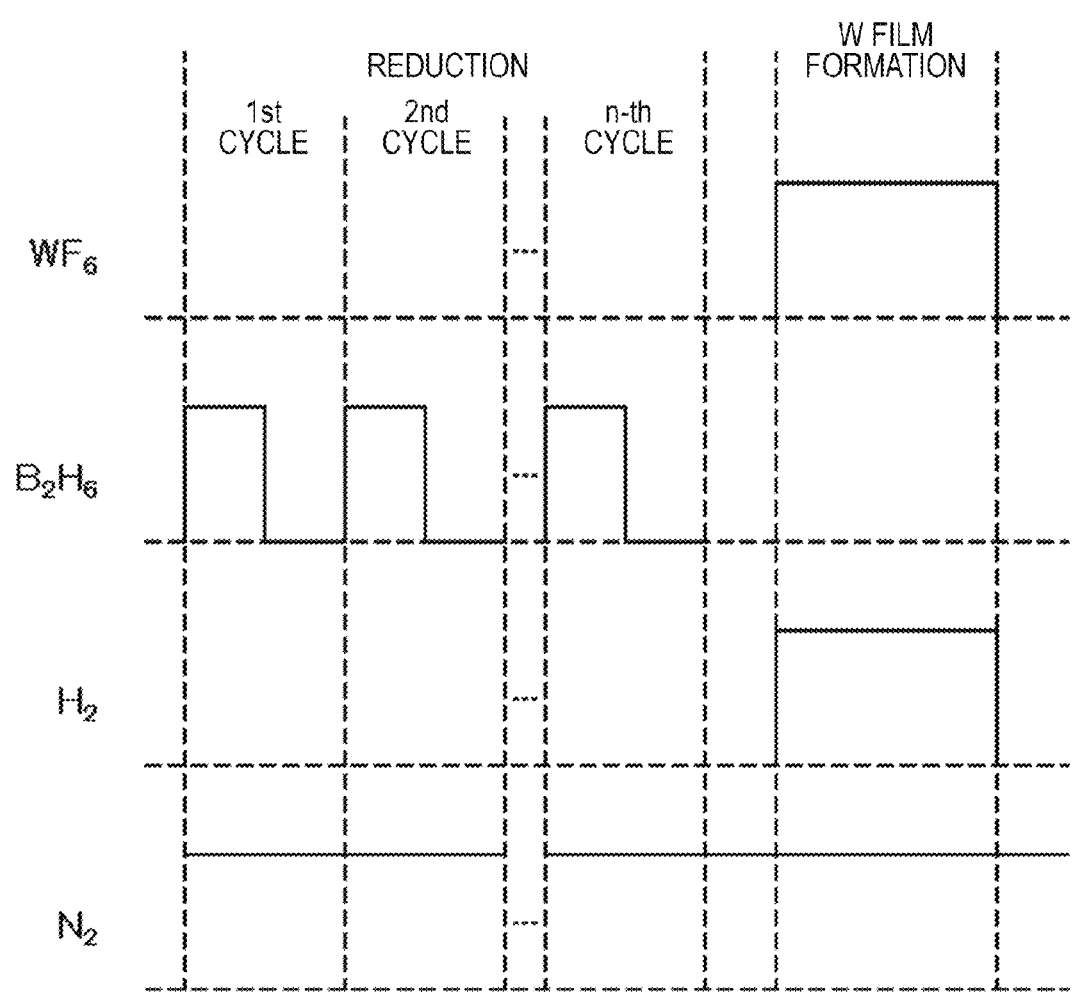
FIG. 6 is a diagram illustrating a time chart of a film formation sequence of the present teachings.
Figure 7:
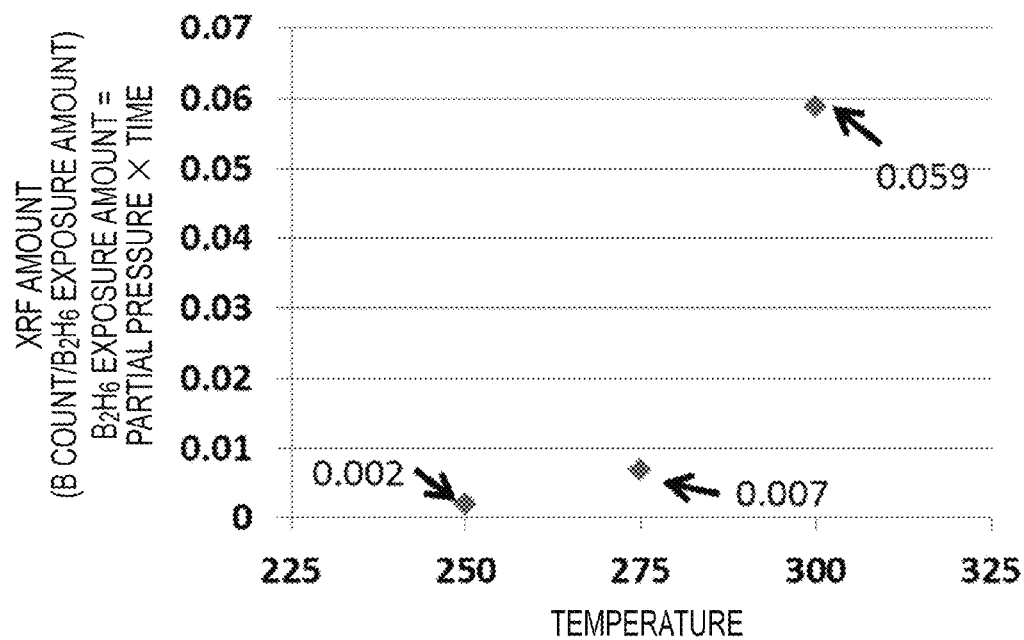
FIG. 7 is a diagram illustrating a result of evaluation of B content on an SiO film by an XRF method.

FIG. 7 illustrates a result of evaluation of B content (XRF amount) by an X-ray fluorescence analysis (XRF) performed on a wafer provided with a $B_2H_6$ adsorbing layer by supplying a $B_2H_6$ gas to the wafer where a SiO film is formed in a reduction step illustrated in FIG. 6. In FIG. 7, indicated is B content=B count (number of B atoms)/$B_2H_6$ exposure amount. The $B_2H_6$ exposure amount is partial pressure [Pa]×time [minutes]. The process condition used in the reduction step is described hereinafter. The pressure of the processing chamber was set to be a value (predetermined) in a range of 400 to 600 Pa. (I) In a case where the temperature of the wafer was set to 250° C., the partial pressure of the $B_2H_6$ gas was set to 1 Pa, and the supply time of the $B_2H_6$ gas was set to 1 minute. (II) In a case where the temperature of the wafer was set to 275° C., the partial pressure of the $B_2H_6$ gas was set to 3 Pa, and the supply time of the $B_2H_6$ gas was set to 2 minutes. (III) In a case where the temperature of the wafer was set to 300° C., the partial pressure of the $B_2H_6$ gas was set to 10 Pa, and the supply time of the $B_2H_6$ gas was set to 5 minutes.

From FIG. 7, in case of (I), the B count is partial pressure (1 Pa)×time (1 minute)×XRF amount (0.002)=0.002; in case of (II), the B count is partial pressure (3 Pa)×time (2 minutes) x XRF amount (0.007)=0.035; and in case of (III), the B count is partial pressure (10 Pa)×time (5 minutes)× XRF amount (0.059)=2.95. In order not to grow the W film on the SiO film, it is preferable that the $B_2H_6$ gas exposure amount is set to be a value so that the B count is in a range not exceeding 0.01 (limit exposure amount). For example, in a case where the temperature of the wafer is set to be 250° C., the $B_2H_6$ gas exposure amount may be adjusted so that the partial pressure of the $B_2H_6$ gas is set to be 5 Pa, and the supply time of the $B_2H_6$ gas is set to be 1 minute.

Figure 8:
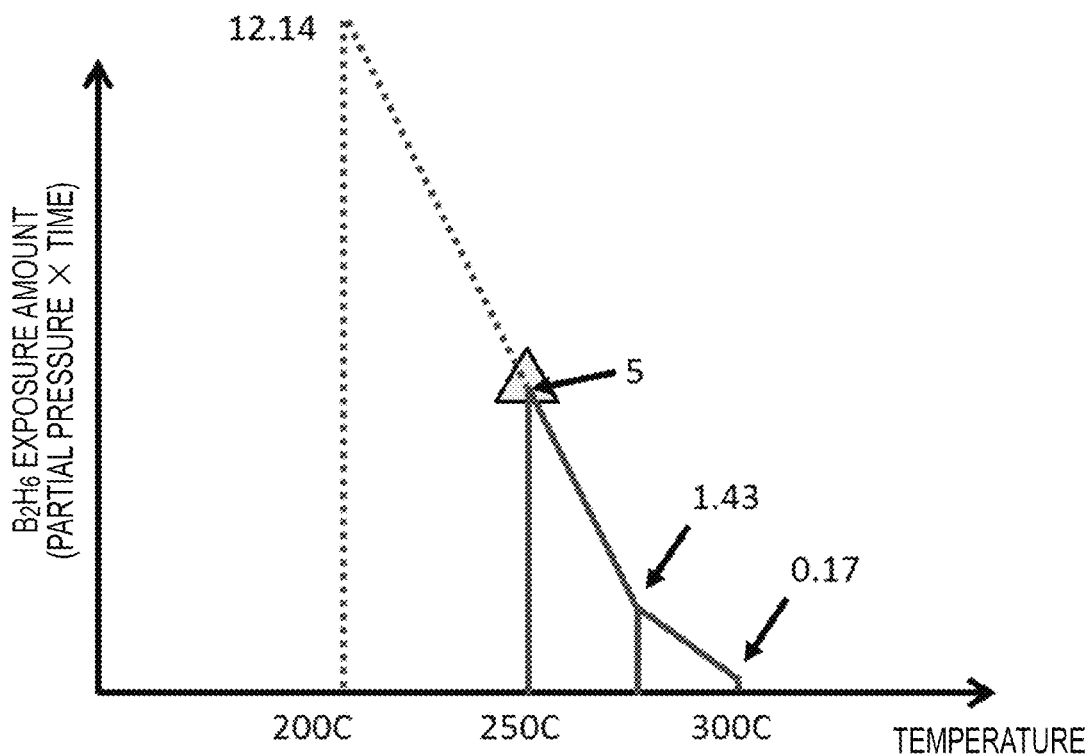
FIG. 8 is a diagram illustrating limit exposure amounts of $B_2H_6$ gas in a plurality of temperature ranges.

FIG. 8 illustrates the limit exposure amounts of the $B_2H_6$ gas in respective temperature ranges. In case of 250° C., the limit exposure amount is B count (0.01)/XRF amount (0.002)=5 [ [Pa·minutes]; in case of 275° C., the limit exposure amount is B count (0.01)/XRF amount (0.007)= 1.43 [Pa·minutes]; and in case of 300° C., the limit exposure amount is B count (0.01)/XRF amount (0.059)=0.17 [Pa·minutes]. In addition, in case of 200° C., an estimated value of the limit exposure amount is 12.14[Pa·minutes].

(3) Effects According to the Embodiment

According to the embodiment, it is possible to obtain one or a plurality of the effects as follows.

(A) When a metal film is to be preferentially grown (selectively grown) on a plurality of conductive films by reducing the plurality of the conductive films exposed on a substrate by supplying a first reducing gas to the substrate where an insulating film and the plurality of the conductive films having different incubation times are exposed to the surface thereof and by controlling a process condition of the first reducing gas so that a difference in incubation time of the plurality of the conductive films is 0.01% or more and 50% or less, thereby equalizing the incubation times among the plurality of the conductive films, it is possible to form a homogeneous film with a good film thickness uniformity. For example, in the above-described embodiment, when a W film as a metal film is to be preferentially grown (selectively grown) on a Ta film, a TaN film, and a Cu film by reducing the Ta film, the TaN film, and the Cu film exposed on a substrate by supplying a $B_2H_6$ gas as a first reducing gas to a substrate where an SiO film as an insulating film and the Ta film, the TaN film, and the Cu film as a plurality of conductive films having different incubation times are exposed to a surface thereof and by adjusting a process condition of the $B_2H_6$ gas so that a difference in incubation time among the Ta film, the TaN film, and the Cu film is 0.01% or more and 50% or less, thereby equalizing the incubation times of the Ta film, the TaN film, and the Cu film, it is possible to form a homogeneous film with a good film thickness uniformity.

(B) When a first reducing gas is to be supplied to a substrate where an insulating film and a plurality of conductive films having different incubation times are exposed to a surface thereof, with respect to process conditions of the first reducing gas including a predetermined temperature of the first reducing gas, a partial pressure of the first reducing gas in a region where the substrate exists, and a time taken to supply the first reducing gas to the substrate, by controlling at least one of the process conditions so that a product of the process conditions becomes a predetermined value, it is possible to reduce the plurality of the conductive films in the state that the insulating film is not substantially reduced.

(C) With respect to the product of the process conditions of (B) described above, by controlling at least one of the process conditions of the first reducing gas so that the average number of atoms per unit area included in the first reducing gas adsorbed on the insulating film becomes 0.0001 or more and 0.01 or less, it is possible to reduce the plurality of the conductive films in the state that the insulating film is not substantially reduced.

MODIFIED EXAMPLE 1

Figure 9:
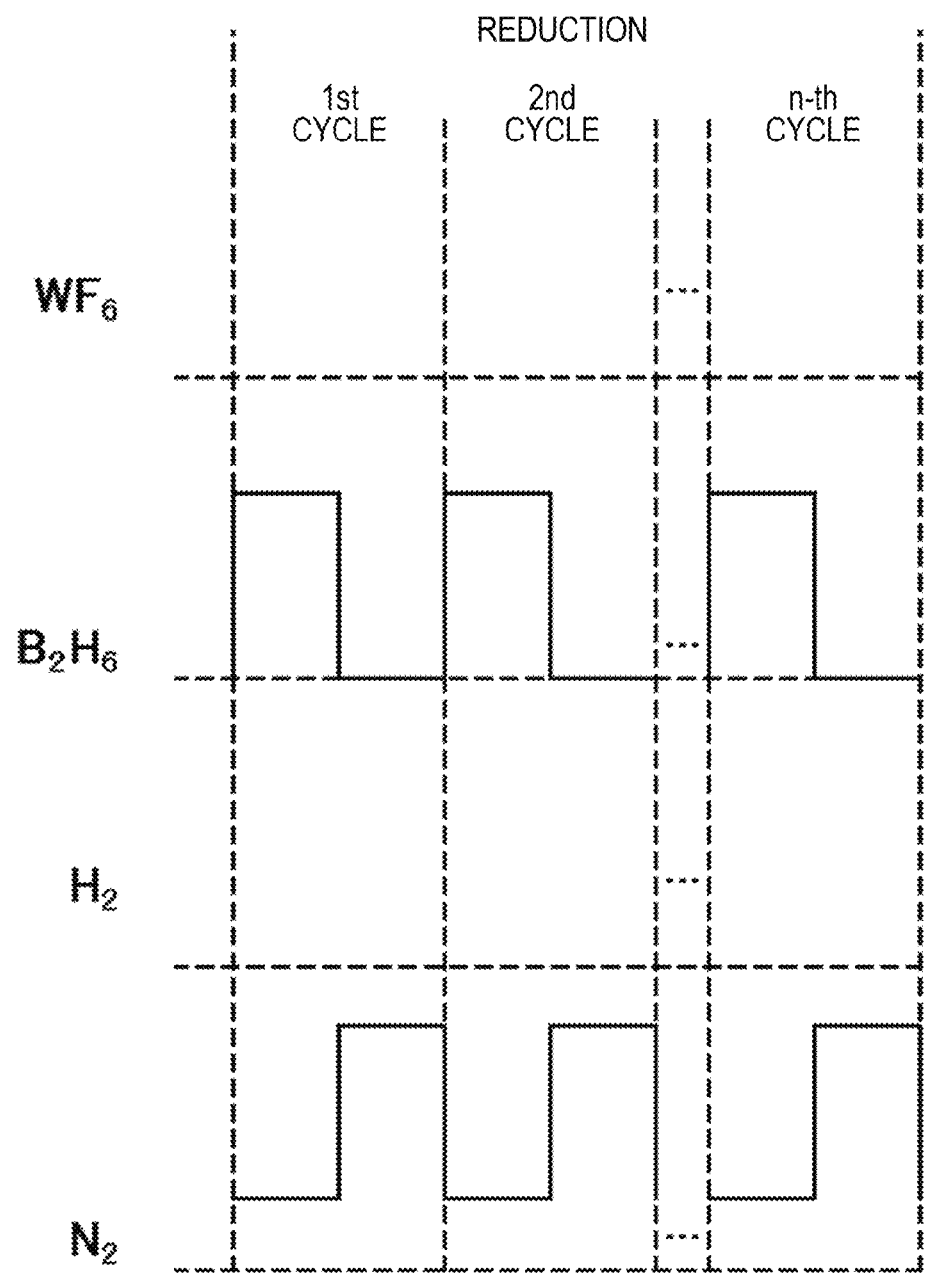
FIG. 9 is a diagram illustrating a time chart of a reduction step in Modified Example 1 of the present teachings.

During the process of the reduction step, a total pressure of an inner portion of the processing chamber 201 (namely, the region where the wafer 200 exists) may be set to be constant. Namely, the total pressure of the inner portion of the processing chamber 201 in the $B_2H_6$ gas supplying step and the remaining gas removing step may be set to be constant. For example, as illustrated in FIG. 9, in the $B_2H_6$ gas supplying step, the supply flow rate of the $N_2$ gas is decreased so that the partial pressure of the $N_2$ gas is decreased; and in the remaining gas removing step, the supply flow rate of the $N_2$ gas is increased so that the partial pressure of the $N_2$ gas is increased. According to the Modified Example, in addition to being capable of obtaining the same effects as those of the film formation sequence illustrated in FIG. 6, during the process of the reduction step, by setting the total pressure of the inner portion of the processing chamber 201 to be constant, it is possible to suppress the thermal decomposition of the $B_2H_6$ gas due to adiabatic expansion.

MODIFIED EXAMPLE 2

Figure 10:
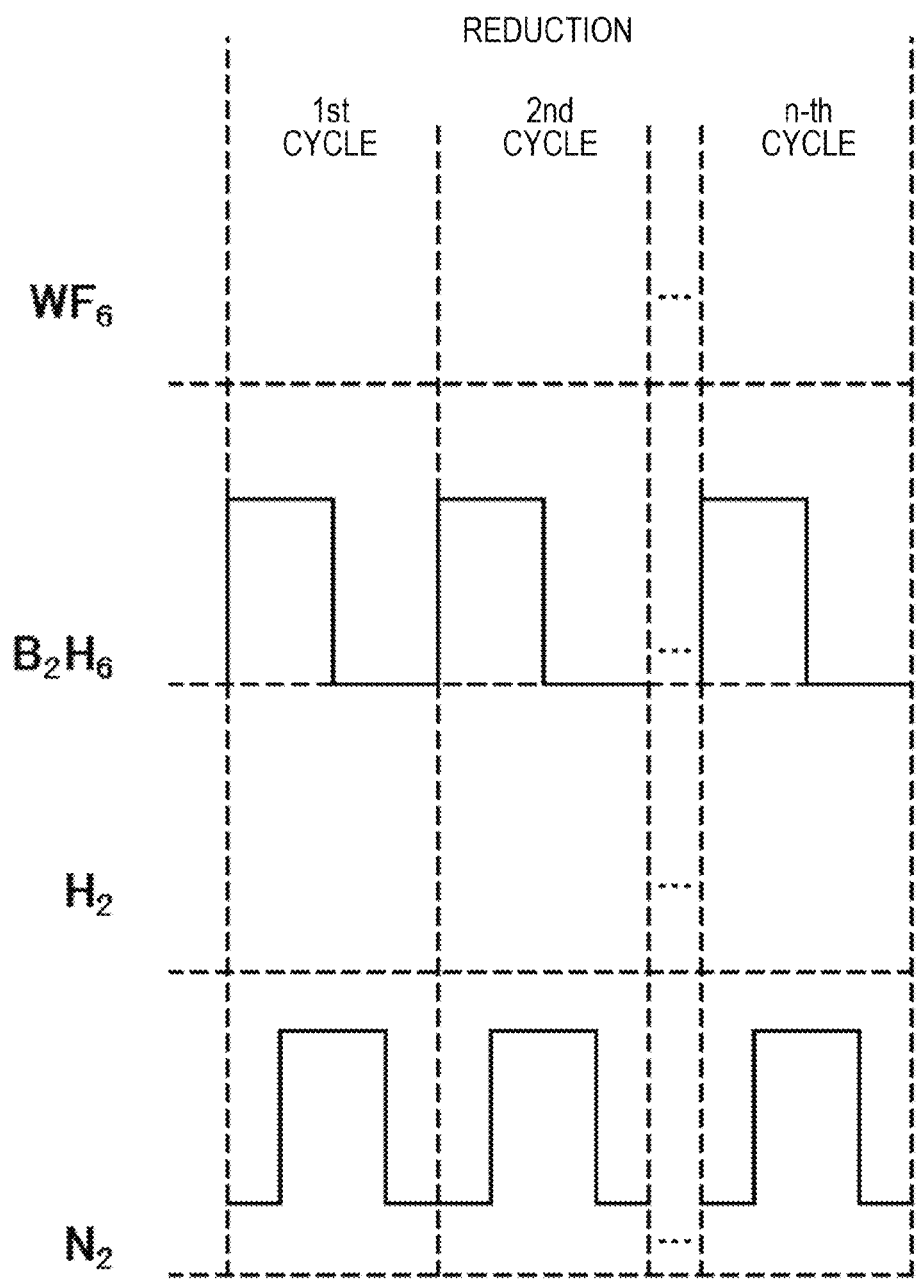
FIG. 10 is a diagram illustrating a time chart of a reduction step in Modified Example 2 of the present teachings.

As illustrated in FIG. 10, in the $B_2H_6$ gas supplying step of the reduction step, the total pressure is increased by increasing the partial pressure of the $N_2$ gas in the middle; and in the remaining gas removing step of the reduction step, the total pressure is decreased by decreasing the partial pressure of the $N_2$ gas in the middle. According to the Modified Example, in addition to being capable of obtaining the same effects as those of the film formation sequence illustrated in FIG. 6, by increasing the total pressure, it is possible to obtain the effect of suppressing the decomposition of the $B_2H_6$ gas and, at the same time, purging the decomposed material of the $B_2H_6$ gas.

<Other Embodiments>

The present teachings are not limited to the above-described embodiments, but various changes are available within the scope without departing from the spirit of the present teachings.

In the above-described embodiment, a case where W is used as a metal element was described. The present teachings is not limited to the above-described aspect, but the present teachings are very appropriately applied to the case of forming a metal film that is a single-element film including an element such as titanium (Ti), tantalum (Ta), cobalt (Co), yttrium (Y), ruthenium (Ru), aluminum (Al), molybdenum (Mo), or niobium (Nb) as an element other than W, or any one of a nitride film, an oxide film, a carbide film, and a boride film, or a composite film thereof. In addition, in case of using a B-containing gas such as diborane ($B_2H_6$) as a first reducing gas, the present teachings can be very appropriately applied to the case of forming a boride film, a boron nitride film, or the like containing B as constituent elements of the film.

In case of forming a film containing the above-described element, beside the tungsten (W)-containing gas, a titanium (Ti)-containing gas, a tantalum (Ta)-containing gas, a cobalt (Co)-containing gas, an yttrium (Y)-containing gas, a ruthenium (Ru)-containing gas, an aluminum (Al)-containing gas, a molybdenum (Mo)-containing gas, a niobium (Nb)-containing gas, a manganese (Mn)-containing gas, a nickel (Ni)-containing gas or the like can be used as the processing gas.

In case of forming a film containing the above-described element, for example, beside the $WF_6$, for example, titanium (Ti), tungsten hexachloride ($WCl_6$), titanium tetrafluoride ($TiF_4$), titanium tetrachloride ($TiCl_4$), tantalum pentafluoride ($TaF_5$), tantalum pentachloride ($TaCl_5$), cobalt difluoride ($CoF_2$), cobalt dichloride ($CoCl_2$), yttrium trifluoride ($YF_3$), Yttrium trichloride ($YCl_3$), ruthenium trifluoride ($RuF_3$), ruthenium trichloride ($RuCl_2$), aluminum trifluoride ($AlF_3$), aluminum trichloride ($AlCl_3$), molybdenum pentafluoride ($MoF_5$), molybdenum pentachloride ($MoCl_5$), niobium trifluoride ($NbF_3$), niobium trichloride ($NbCl_3$), manganese difluoride ($MnF_2$), manganese dichloride ($MnCl_2$), nickel difluoride ($NiF_2$), nickel dichloride ($NiCl_2$) or the like can be used as a metal-containing source gas.

In the above-described embodiment, although the example where the $B_2H_6$ as a B-containing gas is used as the first reducing gas is described, instead of the $B_2H_6$, triborane ($B_3H_8$) gas or the like may be used; and instead of a B-containing gas, phosphine ($PH_3$) as a phosphorus (P)- containing gas, monosilane ($SiH_4$) gas, disilane ($Si_2H_6$) gas, or the like as a silicon (Si)-containing gas (silane-based gas), or the like may be used.

In the above-described embodiment, although the example where the $H_2$ gas as an H-containing gas is used as the second reducing gas is described, instead of the $H_2$ gas, deuterium ($D_2$) gas or the like as an H-containing gas containing no other elements may be used.

As the inert gas, besides the $N_2$ gas, a rare gas such as an argon (Ar) gas, a helium (He) gas, a neon (Ne) gas, or a xenon (Xe) gas may be used.

In the above-described embodiment, although the silicon oxide film (SiO film) is exemplified as an insulating which is exposed to the surface of the substrate, the constituent material of the insulating film is not limited to the SiO, but for example, a silicon nitride film (SiN film), a silicon oxynitride film (SiON), or the like may be used.

In the above-described embodiment, although the copper film (Cu film), the tantalum film (Ta film), and the tantalum nitride film (TaN film) are exemplified as the conductive films which are exposed to the surface of the substrate, the constituent material of the conductive films is not limited to Cu, Ta, and TaN, but various metal materials (conductive materials containing metal elements) may be used. Besides the Cu, for example, aluminum (Al), titanium (Ti), titanium nitride (TiN), or the like may be used.

The above-described embodiments, modified examples, application examples, and the like may be used in a form of an appropriate combination thereof. In addition, the process conditions of the case are set, for example, to be the same as the process conditions of the above-described embodiment.

It is preferable that recipes (programs where process procedures or process conditions are written) used for the substrate process are individually prepared according to contents of process (film types, composition ratios, film qualities, film thicknesses, process procedures, process conditions, and the like of films which are to be formed) and are stored in the memory device 121c through an electric communication line or the external memory device 123. It is preferable that, when starting substrate processes, the CPU 121a appropriately selects a proper recipe according to the contents of the process among plural recipes stored in the memory device 121c. Therefore, films having various film types, composition ratios, film qualities, and film thicknesses can be allowed to be formed with good reproducibility by one substrate-processing apparatus. In addition, the burden of the operator (burden of inputting of the process procedure, the process condition, and the like) can be reduced, so that it is possible to avoid manipulation mistake, and it is possible to quickly start the substrate process.

The above-described recipe is not limited to a case where the recipe is newly produced, but for example, an existing recipe which is installed in advance in the substrate-processing apparatus may be modified to be prepared. In the case of modifying the recipe, the modified recipe may be installed in the substrate-processing apparatus through an electric communication line or a recording medium where the recipe is recorded. In addition, by manipulating the input/output device 122 included in the existing substrate-processing apparatus, an existing recipe installed in advance in the substrate-processing apparatus may be allowed to be directly modified.

In the above-described embodiment, although the example of performing film formation by using the processing furnace having a structure where the nozzles of supplying processing gases are installed to be erected in one reaction tube and the exhaust outlet is provided to the lower portion of the reaction tube in the substrate processing apparatus that is a batch-type vertical apparatus of processing plural substrates at one time is described, the present teachings can be applied to the case of performing film formation by using a processing furnace having a different structure. For example, the present teachings can be applied to the case of performing film formation by using a processing furnace having a structure where two reaction tubes (an outer reaction tube is referred to as an outer tube, and an inner reaction tube is referred to as an inner tube) having concentric cross-sections are provided and the processing gas is flowed from the nozzles installed to be erected in the inner tube to the exhaust outlet which is opened at the position (line-symmetric position) facing the nozzle with the substrate interposed therebetween in the side wall of the outer tube. In addition, the processing gas may not be supplied from the nozzle installed to be erected in the inner tube, but the processing gas may be supplied from a gas supply inlet which is opened on the side wall of the inner tube. At this time, the exhaust outlet which is opened in the outer tube may be opened according to a height where the plural substrates laminated and accommodated in the processing chamber exist. In addition, the shape of the exhaust outlet may be a hole shape or a slit shape.

In the above-described embodiment, the example of performing film formation by using a batch-type substrate processing apparatus of processing plural substrates at one time was described. The present teachings are not limited to the above-described embodiment, but for example, the present teachings may be very appropriately applied to the case of forming films by using a single-wafer-type substrate processing apparatus of processing one or several substrates at one time. In the above-described embodiments, the examples of forming films by using a substrate-processing apparatus having a hot-wall-type processing furnace were described. The present teachings are not limited to the above-described embodiments, but the present teachings can be appropriately applied to even the case of forming films by using a substrate-processing apparatus having a cold-wall-type processing furnace. Even in such a case, the process sequence and the process condition may be set to be the same as the process sequence and the process condition of, for example, the above-described embodiments.

EXAMPLES

COMPARATIVE EXAMPLE 1

As Comparative Example 1, as illustrated in FIG. 11A, a W film was formed on a wafer where an SiO film as an insulating film and a Ta film, a TaN film, and a Cu film as conductive films are exposed to a surface thereof by using the substrate processing apparatus according to the above-described embodiment. At this time, first, thermal treatment was performed on the wafer by using $H_2$ gas. With respect to the process conditions in the thermal treatment period, the pressure of the processing chamber was set to be a value (predetermined) in a range of 500 to 1500 Pa, the flow rate of the $H_2$ gas was set to be a value (predetermined) in a range of 0.8 to 1.2 slm, and the supply time of the $H_2$ gas was set to be a value (predetermined) in a range of 50 to 70 minutes, and the temperature of the processing chamber was set to be a value (predetermined) in a range of 100 to 300° C. Next, the W film was preferentially grown (selectively grown) on the Ta film, the TaN film, and and the Cu film through the W film forming step illustrated in FIG. 6 using the $WF_6$ gas and the $H_2$ gas with the respect to the wafer which was subject to the thermal treatment. With the process conditions used in the W film forming step, the pressure of the processing chamber was set to be a value (predetermined) in a range of 100 to 300 Pa, the flow rate of the $WF_6$ gas was set to be a value (predetermined) in a range of 0.004 to 0.006 L, the flow rate of the $H_2$ gas was set to be a value (predetermined) in a range of 0.8 to 1.2 L, and the supply time of the $WF_6$ gas and the $H_2$ gas was changed to be 10 minutes, 15 minutes, and 20 minutes.

COMPARATIVE EXAMPLE 2

As Comparative Example 2, as illustrated in FIG. 11B, a W film was formed on a wafer where an SiO film as an insulating film and a TaN film and a Cu film as conductive films are exposed to a surface thereof by using the substrate processing apparatus according to the above-described embodiment. Comparative Example 2 is different from Comparative Example 1 only in that a Ta film is not exposed to the surface of the wafer, and the points of performing the thermal treatment and the W film forming step and the process conditions are the same as those of Comparative Example 1.

FIG. 12 illustrates scanning electron microscope (SEM) images (planar structures) of results of formation of the W film in Comparative Examples 1 and 2. The upper row indicates the results of Comparative Example 1, and the lower row indicates the results of Comparative Example 2. In each row, from the left side, illustrated are the results obtained by changing the time taken to supplying the $WF_6$ gas and the $H_2$ gas to 10 minutes, 15 minutes, and 20 minutes. It can be observed that, in Comparative Example 1 where the W film is selectively grown on the wafer where the Ta film and the TaN film are exposed to the surface thereof, the W film is abnormally grown in the results with respect to any times. On the other hand, like Comparative Example 2, on the wafer where the Ta film is not exposed to the surface but only the TaN film is exposed, the W film is not abnormally grown. Therefore, it is considered that the W film is abnormally grown on the Ta film. It is considered that this is because the incubation time of the Ta film is shorter than the incubation time of the TaN film or the Cu film. In addition, it can be understood that, as the supply time of the $WF_6$ gas and the $H_2$ gas is set to be long, the degree of abnormal growth of the W film is increased.

Figure 13:
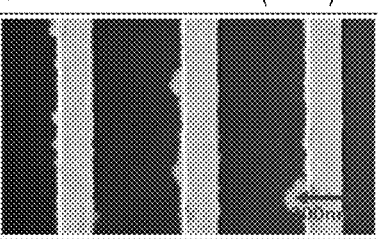
FIG. 13 illustrates pictures (planar structure) of STEM of Comparative Examples 1 and 2.
Figure 14:
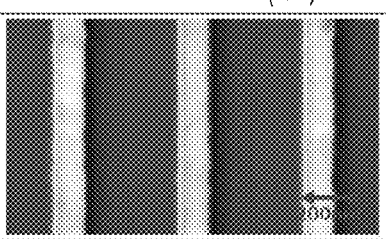
FIG. 14 illustrates pictures (cross-sectional structure) of STEM of Comparative Examples 1 and 2.

FIGS. 13 and 14 illustrate scanning transmission electron microscope (STEM) images of the results of formation of the W film in Comparative Examples 1 and 2. FIG. 13 illustrates planar structures, and FIG. 14 illustrates cross-sectional structures. Comparative Example 1 are results obtained by setting the supply time of the $WF_6$ gas and the $H_2$ gas to 10 minutes, and Comparative Example 2 are results obtained by setting the supply time of the $WF_6$ gas and the $H_2$ gas to 20 minutes. It is observed from FIGS. 13 and 14 that the W film is abnormally grown in Comparative Example 1, but the W film is not abnormally grown in Comparative Example 2. In addition, it is observed from energy dispersive X-ray spectroscopy (EDX) performed in the STEM observation illustrated in the lower rows in FIGS. 13 and 14 that the W film is abnormally grown in Comparative Example 1, but the W film is not abnormally grown but preferentially grown on the TaN film and the Cu film in Comparative Example 2.

EXAMPLE

As Example, as illustrated in FIG. 11A, a W film was formed on a wafer where an SiO film as an insulating film and a Ta film, a TaN film, and a Cu film as conductive films are exposed to a surface thereof by using the substrate processing apparatus according to the above-described embodiment. At this time, first, thermal treatment was performed on the wafer by using $H_2$ gas. The process conditions in the thermal treatment are the same as those of Comparative Example 1. Next, the reduction step illustrated in FIG. 6 was performed on the wafer which is subject to the thermal treatment by using $B_2H_6$ gas. With respect to the process conditions used in the reduction step, the pressure of the processing chamber was set to be a value (predetermined) in a range of 400 to 600 Pa, the partial pressure of the $B_2H_6$ gas was set to be a value (predetermined) in a range of 4 to 6 Pa, the flow rate of the $B_2H_6$ gas was set to be a value (predetermined) in a range of 0.02 to 0.06 L, and the supply time of the $B_2H_6$ gas was set to be a value (predetermined) in a range of 50 to 70 seconds. After the reduction step, the W film was preferentially grown (selectively grown) on the Ta film, the TaN film, and the Cu film by performing the W film forming step illustrated in FIG. 6 on the wafer by using the $WF_6$ gas and the $H_2$ gas. The process condition used in the W film forming step is the same except that the pressure for supplying the $WF_6$ gas and the $H_2$ gas is changed to 400 to 600 Pa.

Figure 15:
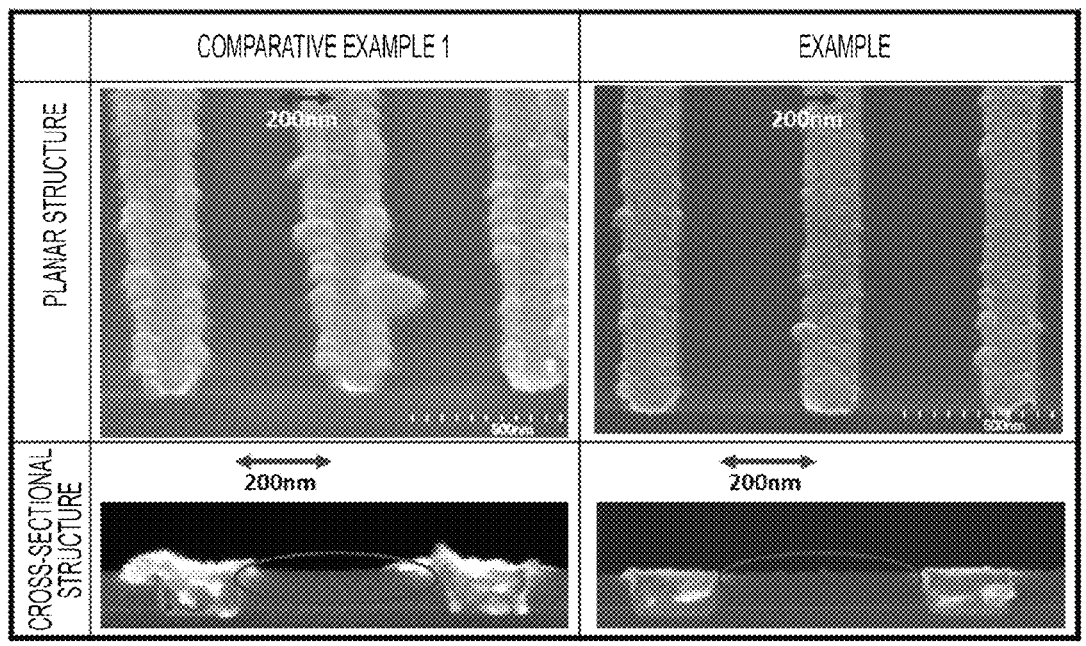
FIG. 15 illustrates pictures of SEM of Example and Comparative Example 1.

FIG. 15 illustrates scanning electron microscope (SEM) images (planar structures and cross-sectional structures) of results of formation of the W film in Example and Comparative Example 1. It can be understood that the W film is abnormally grown in Comparative Example 1, but the abnormal growth of the W film is suppressed in Example. However, as can be understood from the comparison between circled portions of the cross-sectional structures, the W film is slightly formed on the SiO film in Example. It is considered that this is because a small amount of the SiO film is reduced (a small amount of a $B_2H_6$ adsorbing layer is formed on the SiO film) due to the exposure to the $B_2H_6$ gas. Therefore, it can be understood that there is a possibility that the selectivity is deteriorated due to excessive exposure to the $B_2H_6$ gas.

Figure 16:
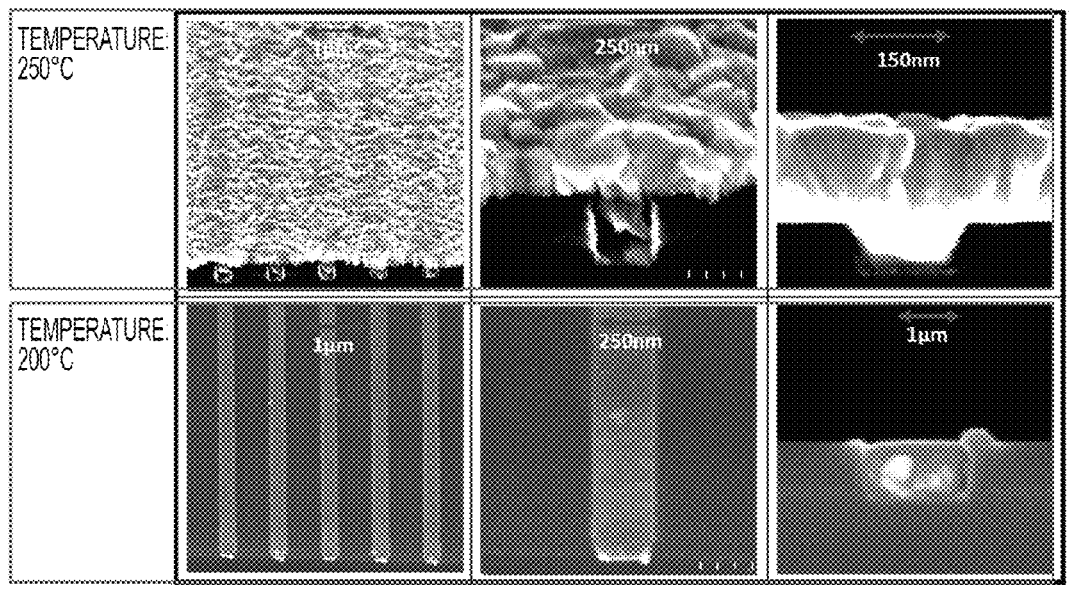
FIG. 16 illustrates pictures of SEM of Comparative Example 3.

FIG. 16 illustrates scanning electron microscope (SEM) images (planar structures and cross-sectional structures) of results of formation of the W film obtained by changing the temperature of the wafer to 200° C. and 250° C. and by setting the supply time of the $WF_6$ gas and the $H_2$ gas to be 80 to 100 minutes in Comparative Example 2. The other process conditions are the same as those of Comparative Example 2. It is observed that the W film is formed in case of 250° C., and the W film is not almost formed in case of 200° C. Therefore, it is preferable that, in case of forming the W film, the temperature of the wafer is set to be at least 200° C. or more.

What is claimed is:

1. A method of manufacturing a semiconductor device, comprising:
   providing a substrate having an insulating film and a plurality of conductive films on a surface thereof, wherein each of the plurality of conductive films has a different incubation time;
   reducing the plurality of the conductive films by supplying a first reducing gas to the substrate, wherein process conditions of the first reducing gas are controlled so that a difference in incubation time among the plurality of conductive films is 0.01% or more and 50% or less; and
   selectively forming a metal film on the plurality of the reduced conductive films by supplying a second reducing gas and a metal-containing gas to the substrate.

2. The method of manufacturing a semiconductor device according to claim 1, wherein the process conditions of the first reducing gas include a partial pressure of the first reducing gas in a region where the substrate exists and a time taken to supply the first reducing gas to the substrate corresponding to a predetermined temperature of the first reducing gas, and by adjusting at least one of the process conditions of the first reducing gas so that a product of the process conditions becomes a predetermined value, the plurality of the conductive films are reduced in a state that the insulating film is not substantially reduced.

3. The method of manufacturing a semiconductor device according to claim 2, wherein the predetermined value is determined so that an average number of atoms per unit area included in the first reducing gas adsorbed on the insulating film becomes a value of 0.0001 or more and 0.01 or less.

4. The method of manufacturing a semiconductor device according to claim 3, wherein the temperature of the first reducing gas is set to be a value in a range of 200 to 300° C., the partial pressure of the first reducing gas in the region where the substrate exists is set to be a value in a range of 0.1 to 10 Pa, and the time taken to supply the first reducing gas to the substrate is set to be a value in a range of 0.01 to 10 minutes.

5. The method of manufacturing a semiconductor device according to claim 1, wherein, in the reducing of the plurality of the conductive films, the first reducing gas is supplied to the substrate in a pulse manner.

6. The method of manufacturing a semiconductor device according to claim 5, wherein, in the reducing of the plurality of the conductive films, an inert gas is supplied at all times to the region where the substrate exists.

7. The method of manufacturing a semiconductor device according to claim 6, wherein, in the reducing of the plurality of the conductive films, a total pressure of the region where the substrate exists is set to be a constant value.

8. The method of manufacturing a semiconductor device according to claim 1, wherein the plurality of the conductive films are metal interconnection and barrier metal films.

9. The method of manufacturing a semiconductor device according to claim 8, wherein the barrier metal films are a tantalum film and a tantalum nitride film, the first reducing gas is a boron-containing gas, the second reducing gas is a hydrogen-containing gas different from the first reducing gas, the metal-containing gas is a tungsten-containing gas, and the metal film is a tungsten film.

10. The method of manufacturing a semiconductor device according to claim 1, wherein the metal film is formed by using a gas-phase reaction of the second reducing gas and the metal-containing gas.

11. The method of manufacturing a semiconductor device according to claim 1, further comprising supplying an etching gas to the substrate where the metal film is formed.

12. The method of manufacturing a semiconductor device according to claim 1, further comprising, before the reducing of the plurality of the conductive films, supplying the second reducing gas to the substrate.

13. A method of manufacturing a semiconductor device, comprising:
providing a substrate having an insulating film and a plurality of conductive films on a surface thereof;
reducing the substrate by supplying a first reducing gas to the substrate so that at least one of a plurality of process conditions of the first reducing gas is controlled so that a product of a plurality of process conditions becomes a predetermined value, wherein the process conditions of the first reducing gas include a partial pressure of the first reducing gas in a region where the substrate exists and a time taken to supply the first reducing gas to the substrate corresponding to a temperature of the first reducing gas; and
selectively forming a metal film on the plurality of the reduced conductive films by supplying a second reducing gas and a metal-containing gas in a gas-phase reacted state to the substrate.

* * * * *